US012796238B1

(12) United States Patent
Zhang et al.

(10) Patent No.: US 12,796,238 B1
(45) Date of Patent: Nov. 10, 2026

(54) DISPLAY PANEL AND DEVICE

(71) Applicants: Visionox Technology Inc., Kunshan (CN); KunShan Go-Visionox Opto-Electronics Co., Ltd., Kunshan (CN); Hefei Visionox Technology Co., Ltd., Hefei (CN)

(72) Inventors: Deqiang Zhang, Kunshan (CN); Chung-Chun Lee, Kunshan (CN); Yuan Yao, Hefei (CN); Yiming Xiao, Hefei (CN); Xuejing Zhu, Hefei (CN); Xiaoting Jiang, Hefei (CN)

(73) Assignees: Visionox Technology Inc., Kunshan (CN); KunShan Go-Visionox Opto-Electronics Co., Ltd., Kunshan (CN); Hefei Visionox Technology Co., Ltd., Hefei (CN)

( * ) Notice: Subject to any disclaimer, the term of this patent is extended or adjusted under 35 U.S.C. 154(b) by 0 days.

(21) Appl. No.: 19/406,815

(22) Filed: Dec. 2, 2025

(30) Foreign Application Priority Data

Jul. 25, 2025 (CN) ........................ 202511031455.4

(51) Int. Cl.
*G09G 3/32* (2016.01)
*G09G 3/3233* (2016.01)
(Continued)

(52) U.S. Cl.
CPC ......... *H10K 59/122* (2023.02); *G09G 3/3233* (2013.01); *H10K 59/1213* (2023.02);
(Continued)

(58) Field of Classification Search
CPC ........... H05B 45/60; H10K 2102/3026; H10K 59/122; H10K 59/173; H10K 59/80515;
(Continued)

(56) References Cited

U.S. PATENT DOCUMENTS

2006/0061525 A1 3/2006 Kim et al.
2019/0280061 A1* 9/2019 Joo ........................ H10K 50/11
2021/0351266 A1* 11/2021 Kasahara .............. H05B 45/60

FOREIGN PATENT DOCUMENTS

CN 110299107 A 10/2019
CN 114551769 A 5/2022
CN 116416935 A 7/2023

OTHER PUBLICATIONS

Chinese Patent Office, First Office Action issued in Chinese Patent Application No. 202511031455.4 dated Aug. 30, 2025.

* cited by examiner

*Primary Examiner* — Insa Sadio
(74) *Attorney, Agent, or Firm* — Kilpatrick Townsend & Stockton LLP

(57) ABSTRACT

Embodiments of the present application provide a display panel, a display apparatus and a device. The display panel includes: a substrate including a base substrate and drive units; a planarization layer including first communication holes; a plurality of first electrodes; a pixel defining layer including a pixel defining portion and pixel openings, an orthographic projection of the pixel opening on the base substrate at least partially overlapping an orthographic projection of the first electrode on the base substrate; an isolation structure enclosing a plurality of isolation openings, the isolation opening being in communication with the pixel opening; and light-emitting units located in the isolation openings. The drive unit is electrically connected to the first electrode by the first communication hole to drive the light-emitting unit to emit light, and the drive unit connected to at least one of the first electrodes includes two or more drive transistors.

20 Claims, 11 Drawing Sheets

(51) Int. Cl.
*H10K 59/121* (2023.01)
*H10K 59/122* (2023.01)
*H10K 59/80* (2023.01)

(52) U.S. Cl.
CPC . *H10K 59/8791* (2023.02); *G09G 2300/0426* (2013.01); *G09G 2300/0842* (2013.01); *G09G 2330/021* (2013.01)

(58) Field of Classification Search
CPC ....... H10K 59/80518; H10K 59/80524; H10K 59/876; H10K 71/621; H10K 77/10; H10K 59/40; Y02B 20/30; Y02E 10/549
See application file for complete search history.

DISPLAY PANEL AND DEVICE

CROSS-REFERENCE TO RELATED APPLICATION(S)

This application claims priority to Chinese Patent Application No. 202511031455.4, filed on Jul. 25, 2025, which is incorporated herein by reference in its entirety.

FIELD

The present application relates to the field of display devices, and particularly to a display panel, a display apparatus, and a device.

BACKGROUND

Organic light-emitting diode (OLED) display technology is considered the most promising next-generation display technology. Compared to liquid crystal display technology, OLED display technology offers advantages such as low power consumption, low costs, self-emission, a wide viewing angle, and a fast response speed.

During the preparation of conventional OLED display panels, light-emitting pixel patterning is usually implemented by a fine metal mask (FMM). FMM technology is mature and has rich experience in mass production. However, FMM technology also has problems such as limited accuracy, and high costs. Fine metal mask-free technology eliminates the limitations of conventional OLED processes on display size, resolution, and other screen performances, and has the advantages of high performance, full-size coverage, and agile delivery. Reference can be made to relevant contents of the fine metal mask-free technology recited in Chinese patents CN 118251982 A, CN 116648095 A, CN 117062489 A, CN 118742138 A, CN 118678783 A, CN 118660598 A, CN 118675450 A, CN 118824188 A, and CN 118781966 A.

However, the performance of conventional OLED display products needs to be improved.

SUMMARY

Embodiments of the present application provide a display panel, a display apparatus and a device, with the aim of improving the performance of the display panel.

An embodiment of the present application provides a display panel. The display panel includes: a substrate including a base substrate and drive units disposed on one side of the base substrate; a planarization layer located on a side of the drive unit facing away from the base substrate and including first communication holes; a first electrode layer disposed on one side of the substrate and including a plurality of first electrodes; a pixel defining layer disposed on one side of the substrate, the pixel defining layer including a pixel defining portion and pixel openings enclosed by the pixel defining portion, an orthographic projection of the pixel opening on the base substrate at least partially overlapping an orthographic projection of the first electrode on the base substrate; an isolation structure disposed on the side of the substrate where the pixel defining layer is located and enclosing a plurality of isolation openings, the isolation opening being in communication with the pixel opening; and a light-emitting functional layer including light-emitting units located in the isolation openings, at least part of the light-emitting unit being located in the pixel opening, where the drive unit is electrically connected to the first electrode by the first communication hole, and at least one of the drive units includes two or more drive transistors, the drive transistor being electrically connected to the first electrode and configured to transmit a drive current to the light-emitting unit to drive the light-emitting unit to emit light.

An embodiment of the present application further provides a display apparatus, including a display panel according to any one of the above embodiments.

An embodiment of the present application further provides a device, including the display panel according to any one of the above embodiments.

In the display panel according to the embodiments of the present application, the display panel includes a substrate, a planarization layer, a first electrode layer, a pixel defining layer, an isolation structure and a light-emitting functional layer. The substrate includes a base substrate and drive units configured to drive light-emitting units of the light-emitting functional layer to emit light, and the planarization layer is configured to improve the planarity of a film layer and the first electrodes are disposed on the more planarized film layer, thereby alleviating the problem of display discrepancy caused by the reflection of light from the first electrodes. The planarization layer is provided with first communication holes and the first electrodes can be electrically connected to the drive units by the first communication holes. The projection of the first electrode of the first electrode layer at least partially overlaps the projection of the pixel opening of the pixel defining layer, and at least part of the first electrode can be exposed by the pixel opening and is in contact with and connected to the light-emitting unit within the pixel opening, to drive the light-emitting unit to emit light for display. The pixel defining portion is configured to alleviate the problem of interference of light output from two adjacent light-emitting units. The isolation structure encloses isolation openings, and can be used to separate a light-emitting material into mutually independent light-emitting units, to simplify the preparation of the display panel. At least one of the drive units includes two or more drive transistors, and drive signals are supplied to the same first electrode by the two or more drive transistors, and the areas of the first electrode and the light-emitting unit are set to be larger, thereby making it more suitable for large-screen display apparatuses.

BRIEF DESCRIPTION OF THE DRAWINGS

By reading the following detailed description of non-limiting embodiments made with reference to the drawings, the other features, objectives and advantages of the present application will become more apparent, in which the same or similar features are denoted by the same or similar reference signs.

LIST OF REFERENCE SIGNS

Figure 1:
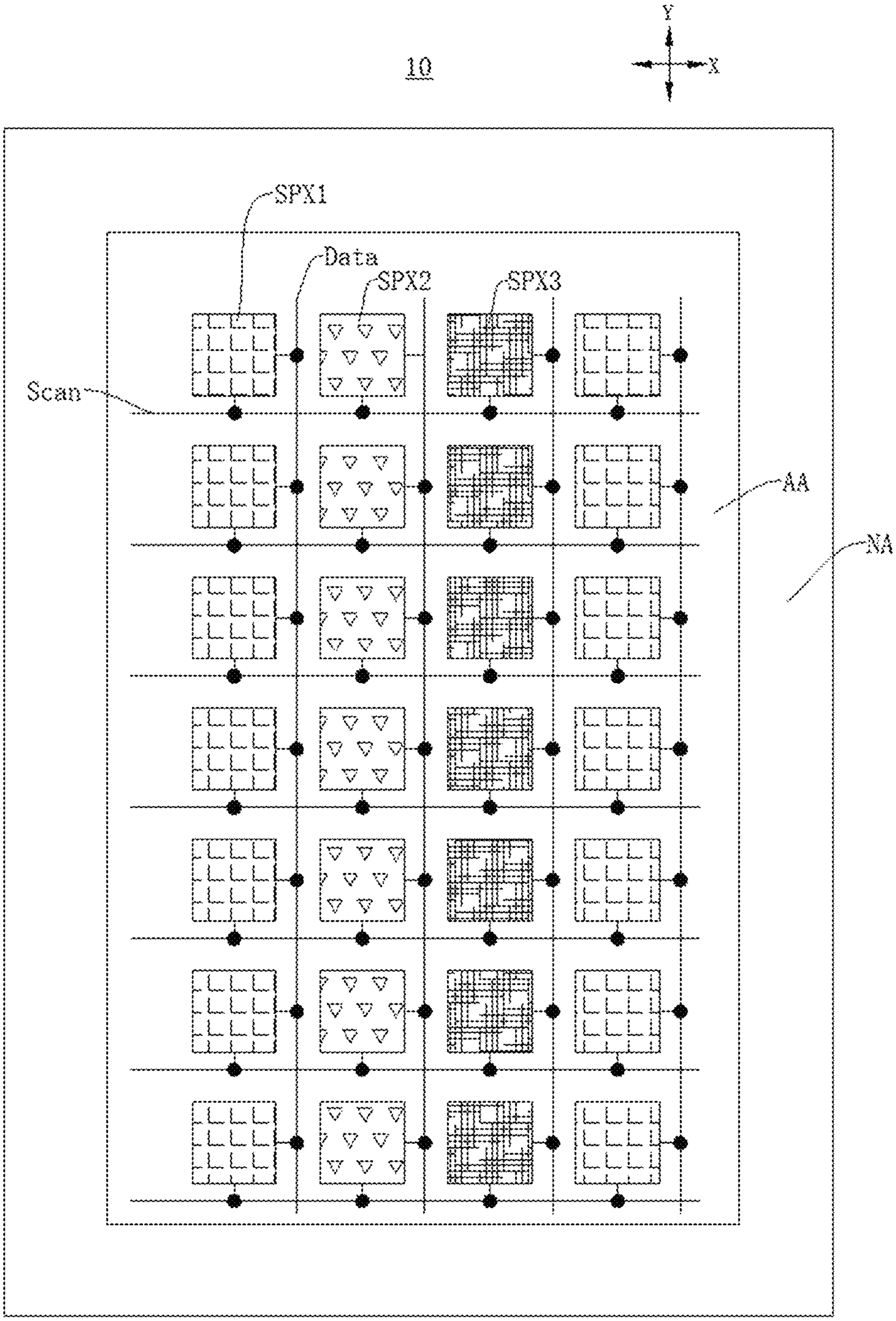
FIG. 1 is a structural schematic diagram of a display panel according to an embodiment of the present application.
Figure 2:
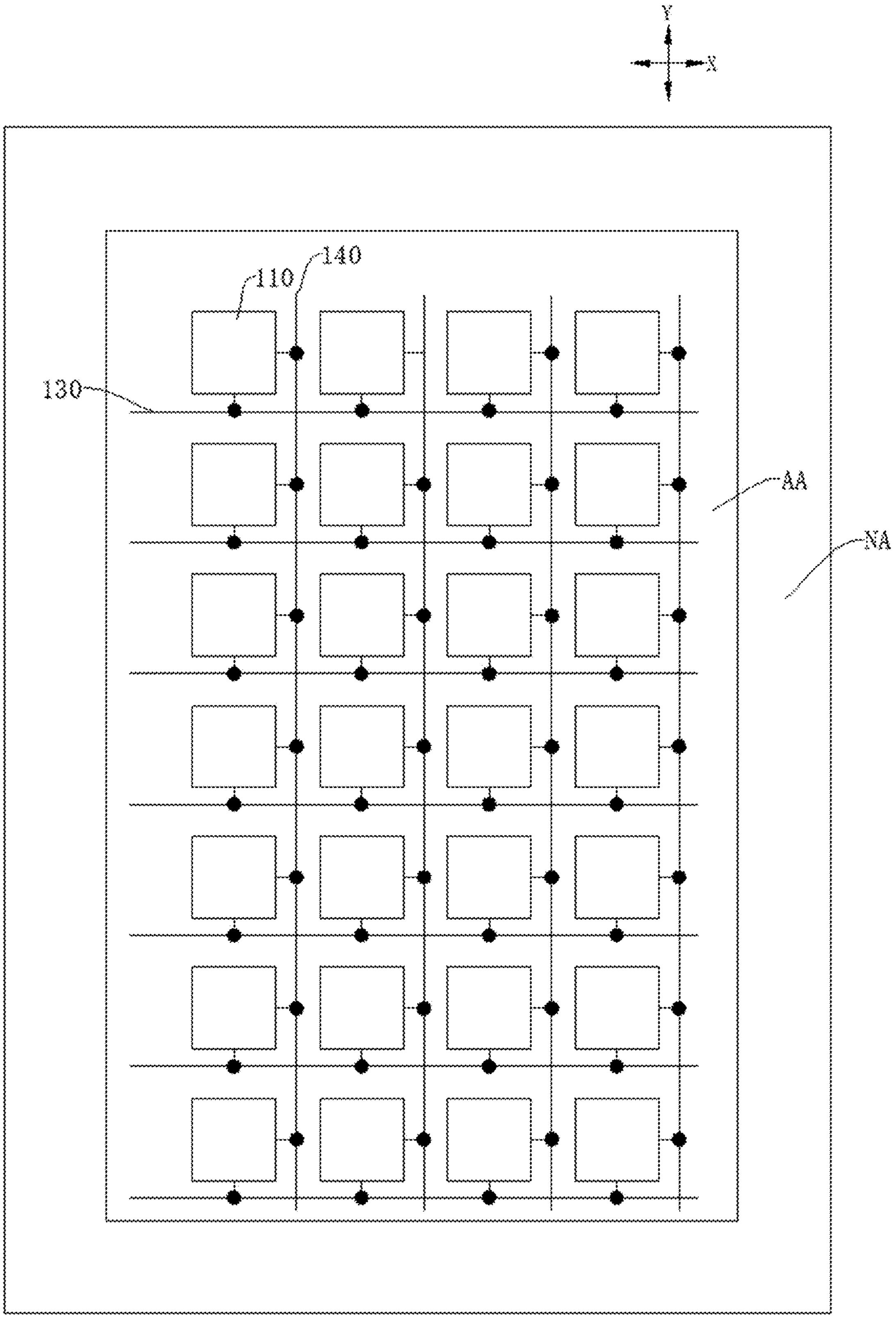
FIG. 2 is a structural schematic diagram of a drive unit of a display panel according to an embodiment of the present application.

10. Display panel, 100. Substrate; 100*a*. Base substrate; 110. Drive unit; 110*a*. First drive unit; 110*b*. Second drive unit; 111. Pixel drive circuit; T1. Drive transistor; T2. Switching transistor; 120. Planarization layer; 121. First communication hole; 130. First signal line; 140. Second signal line;

200. Pixel defining layer; 201. First defining layer; 202. Second defining layer; 210. Pixel defining portion; 220. Pixel opening; 220*a*. First sub-opening; 221. First pixel opening; 222. Second pixel opening; 223. Third pixel opening; 230. Light-emitting unit; 230*a*. Sub-light-emitting unit; 231. First light-emitting unit; 232. Second light-emitting unit; 233. Third light-emitting unit; EML. Light-emitting material layer;

300. Isolation structure; 301. First sublayer; 3011. First side surface; 3011*a*. First subsurface; 3011*b*. Second subsurface; 3012. First bottom surface; 3013. Covering portion; 302. Second sublayer; 303. Third sublayer; 310. Isolation opening; 310*a*. Second sub-opening; 311. First isolation opening; 312. Second isolation opening; 313. Third isolation opening;

400. First electrode layer; 410. First electrode; 411. Sub-electrode;

500. Second electrode layer; 510. Second electrode; 511. Main portion; 512. Contact portion;

600. Encapsulation layer; 610. First encapsulation layer; 611. Encapsulation portion; 611*a*. First section; 611*b*. Second section; 620. Second encapsulation layer; 630. Third encapsulation layer;

α1. First included angle; α2. Second included angle; α3. Third included angle; L. First distance; h. First height; W1. First width; W2. Second width; W3. Third width;

AA. Active area; NA: Non-active area; X. First direction; Y. Second direction; Z. Thickness direction.

DETAILED DESCRIPTION OF THE EMBODIMENTS

In order to make the embodiments of the present application clearer, the embodiments of the present application will be described clearly and completely below with reference to the accompanying drawings in the embodiments of the present application. Apparently, the embodiments described are some of, rather than all of, the embodiments of the present application. In general, assemblies of the embodiments of the present application described and shown in the accompanying drawings herein can be arranged and designed in various configurations.

Thus, the following detailed description of the embodiments of the present application provided in the accompanying drawings is not intended to limit the scope of the present application as claimed, but is merely representative of the selected embodiments of the present application.

It should be noted that like items are denoted by like numerals and letters in the following drawings. Therefore, once a specific item is defined in one of the drawings, the item needs not to be further defined and explained in subsequent drawings. It should be noted that different features in the embodiments of the present application may be combined with each other without conflicts.

For ease of understanding, the drawings illustrate mutually orthogonal X-axis, Y-axis, and Z-axis. The direction along the X-axis is defined as the X direction, the direction along the Y-axis as the Y direction, and the direction along the Z-axis as the Z direction. The Z direction is the direction normal to the plane defined by the X direction and the Y direction. In addition, a view in which various elements are observed parallel to the plane defined by the X direction and the Y direction is referred to as a top view. Alternatively, the plane defined by the X direction and the Y direction is parallel to the display plane of the display panel 10, and the Z direction is parallel to the thickness direction Z of the display panel 10.

For certain elements, the term such as “upper” or “above” may be used to indicate the position of an element in the Z direction, while the term such as “lower” or “below” may be used to indicate the position of an element in the opposite direction. In addition, when the terms such as “upper”, “above”, “lower”, “below”, and “relative” are used to define the positional relationship between two elements, the relationship includes not only a state in which the two elements are in direct contact, but also a state in which the two elements are separated by a gap or by other elements. In addition, the terms such as “first”, “second” and “third” are merely intended to distinguish the description, and are not to be construed as indicating or implying relative importance.

For large-screen display apparatuses such as televisions, sub-pixels of the display apparatuses rarely directly employ OLED true sub-pixels. For example, in the related art, a backlight unit is provided and quantum dot materials are used to change the color of emitted light, thereby achieving a colored display and forming sub-pixels of different colors.

Alternatively, a backlight unit of a single color is provided, and the color of emitted light is changed by filtering and the like to form sub-pixels of different colors. This will significantly increase the power consumption of the display apparatus and affects the display effect of the display apparatus.

Fine metal mask-free technology eliminates the limitations of conventional OLED processes on display size, resolution, and other screen performances, and has the advantages of high performance, full-size coverage, and agile delivery. The combination of fine metal mask-free technology with OLED sub-pixels for large-screen display apparatuses such as televisions has become a trend. However, since the large-screen display apparatuses such as televisions have a relatively large display area and a relatively low pixel density, which results in that the area of sub-pixel is usually set larger, the pixel drive circuit 111 is required to provide 2 to 25 times more current than the conventional small-screen products such as mobile phones. Therefore, the power supply capability and device stability of the pixel drive circuit are severely tested. The problem of insufficient power supply capacity of the pixel drive circuit leads to low brightness of TV products, preventing them from achieving high brightness, while the problem of drift of the device characteristics due to excessive current results in a change in the display color accuracy (color shift) or a decrease in brightness.

In order to solve the above problems, the present application has been filed. In order to better understand the present application, a display panel 10, a display apparatus and a device according to the present application will be described below with reference to FIGS. 1-20.

FIG. 1 is a structural schematic diagram of a display panel 10 according to one implementation of the present application. The display panel 10 may be an organic light-emitting diode (OLED) display panel 10 or a quantum dot light-emitting diode (QLED) display panel 10. The display panel 10 includes an active area AA having a display function and a non-active area NA.

The active area AA of the display panel 10 may have a rectangular shape, or may have a square, circular, elliptical, or other shape.

The active area AA includes a plurality of pixels PX arranged in the X direction and the Y direction. Each pixel PX includes a plurality of sub-pixels SPX configured to display different colors. In some embodiments, the pixel PX includes a first sub-pixel SPX1, a second sub-pixel SPX2, and a third sub-pixel SPX3. For example, the first sub-pixel SPX1 is a blue sub-pixel, the second sub-pixel SPX2 is a green sub-pixel SPX2, and the third sub-pixel SPX3 is a red sub-pixel SPX3. In some embodiments, each pixel PX includes not only the sub-pixels SPX1, SPX2, and SPX3, but also a sub-pixel SPX configured to emit white light or light of another color.

The sub-pixel SPX includes a pixel drive circuit and a light-emitting device driven by the pixel drive circuit to emit light of a corresponding color. The first sub-pixel SPX1 includes a first light-emitting device, the second sub-pixel SPX2 includes a second light-emitting device, and the third sub-pixel SPX3 includes a third light-emitting device. One pixel drive circuit drives at least one light-emitting device to emit light. For example, the active area AA may include a normal active area AA and a transmissive active area AA. The transmissive active area AA is an active area AA disposed corresponding to a sensor and has light-transmitting properties, whereas the normal active area AA is an active area AA not disposed corresponding to any sensor. In the normal active area AA, one pixel drive circuit drives one light-emitting device to emit light, while in the transmissive active area AA, one pixel drive circuit drives one or more light-emitting devices to emit light.

As shown in FIGS. 2 to 5, an embodiment of the present application provides a display panel 10. The display panel 10 includes: a substrate 100, including a base substrate 100*a* and drive units 110 disposed on one side of the base substrate 100*a*; a planarization layer 120 located on a side of the drive unit 110 facing away from the base substrate 100*a* and including first communication holes 121; a first electrode layer 400 disposed on one side of the substrate 100 and including a plurality of first electrodes 410; a pixel defining layer 200 disposed on one side of the substrate 100, the pixel defining layer 200 including a pixel defining portion 210 and pixel openings 220 enclosed by the pixel defining portion 210, an orthographic projection of the pixel opening 220 on the base substrate 100*a* at least partially overlapping an orthographic projection of the first electrode 410 on the base substrate 100*a*; an isolation structure 300 disposed on the side of the substrate 100 where the pixel defining layer 200 is located and enclosing a plurality of isolation openings 310, the isolation opening 310 being in communication with the pixel opening 220; and a light-emitting functional layer including light-emitting units 230 located in the isolation openings 310, at least part of the light-emitting unit 230 being located in the pixel opening 220. The drive unit 110 is electrically connected to the first electrode 410 by the first communication hole 121, and at least one of the drive units 110 includes two or more drive transistors T1, the drive transistor T1 being electrically connected to the first electrode 410 and configured to transmit a drive current to the light-emitting unit 230 to drive the light-emitting unit 230 to emit light.

In the display panel 10 according to the embodiments of the present application, the display panel 10 includes a substrate 100, a planarization layer 120, a first electrode layer 400, a pixel defining layer 200, an isolation structure 300 and a light-emitting functional layer. The substrate 100 includes a base substrate 100*a* and drive units 110 configured to drive light-emitting units 230 of the light-emitting functional layer to emit light, and the planarization layer 120 is configured to improve the planarity of a film layer and the first electrodes 410 are disposed on the more planarized film layer, thereby alleviating the problem of display discrepancy caused by the reflection of light from the first electrodes 410. The planarization layer 120 is provided with first communication holes 121 and the first electrodes 410 can be electrically connected to the drive units 110 by the first communication holes 121. The projection of the first electrode 410 of the first electrode layer 400 at least partially overlaps the projection of the pixel opening 220 of the pixel defining layer 200, and at least part of the first electrode 410 can be exposed by the pixel opening 220 and is in contact with and connected to the light-emitting unit 230 within the pixel opening 220, to drive the light-emitting unit 230 to emit light for display. The pixel defining portion 210 is configured to alleviate the problem of interference of light output from two adjacent light-emitting units 230. The isolation structure 300 encloses isolation openings 310, and the isolation structure 300 can be used to separate a light-emitting material into mutually independent light-emitting units 230, to simplify the preparation of the display panel 10. At least one of the drive units 110 includes two or more drive transistors T1, and drive signals are supplied to the same first electrode 410 by the two or more drive transistors T1, and the areas of the first electrode 410 and the light-emitting unit 230 are set to be larger, thereby making it more suitable for large-screen display apparatuses.

Furthermore, in the display panel 10 according to the embodiments of the present application, since the same first electrode 410 is connected to two or more drive transistors T1, even if the display panel 10 is used in a large-screen display device such as a television, when the area of the pixel opening 220 is large, it is also possible to ensure that the light-emitting unit 230 can be properly driven for display, thereby ensuring the display effect of the display panel 10.

Figure 4:
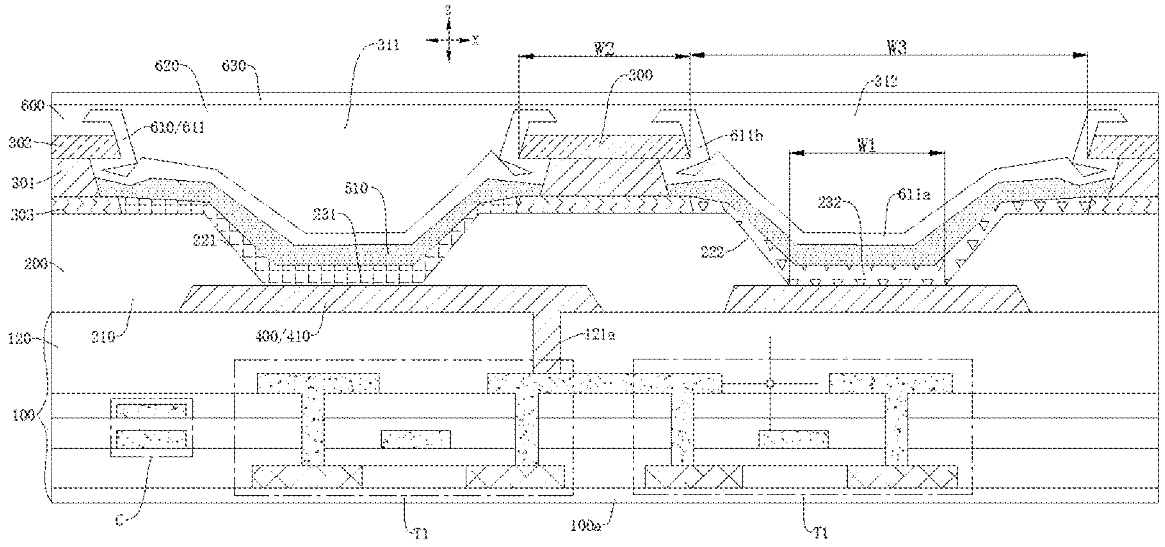
FIG. 4 is a partial cross-sectional view of FIG. 3.

The substrate 100 may be configured in various ways. In one embodiment, as shown in FIG. 4, the substrate 100 includes a base substrate 100*a* and drive units 110. The drive unit 110 may include a pixel drive circuit 111. For example, the substrate 100 includes a base substrate 100*a*, and a drive circuit layer and a planarization layer 120 which are disposed on the base substrate 100*a*. The pixel drive circuit 111 includes a transistor and a capacitor. The capacitor includes a first plate and a second plate, and the transistor includes a source, a drain, a gate, and a semiconductor layer. The drive circuit layer further includes a plurality of signal lines, such as data signal lines, scan signal lines, and power signal lines. The drive circuit layer includes a plurality of conductive layers, including a first conductive layer, a second conductive layer, and a third conductive layer. The gate and the first plate may be located at the first conductive layer, the second plate may be located at the second conductive layer, and the source and the drain may be located at the third conductive layer.

Figure 5:
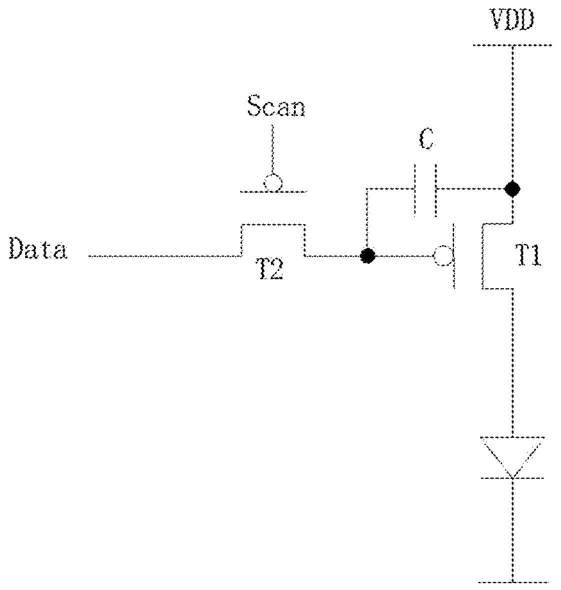
FIG. 5 is a structural schematic diagram of a pixel drive circuit of a display panel according to an embodiment of the present application.

In one embodiment, referring to FIG. 5, the pixel drive circuit 111 includes a drive transistor T1 and a switching transistor T2. A first terminal of the switching transistor T2 is connected to a data line for supplying a data signal Data, a gate of the switching transistor T2 is connected to a scan line for supplying a scan signal Scan, and a second terminal of the switching transistor T2 is connected to the drive transistor T1 for transmitting the data signal to the drive transistor T1. One of the first and second terminals of the switching transistor T2 is the source and the other is the drain. A plate of a storage capacitor C1 is connected to a gate of the drive transistor T1 for maintaining the voltage of the gate of the drive transistor T1. The drive transistor T1 is connected between a power signal line VDD and a light-emitting device to drive the light-emitting device to emit light. FIG. 5 is one embodiment of the pixel drive circuit 111. The pixel drive circuit 111 of the present application is not limited to the pixel drive circuit 111 of a 2T1C configuration shown in FIG. 5, but may be other pixel drive circuits 111, such as a pixel drive circuit 111 of a 7T1C or 8T1C configuration.

In one embodiment, in an embodiment of the present application, the drive units 110 are configured to drive the light-emitting units 230, the drive units 110 and the light-emitting unit 230 are disposed in one-to-one correspondence, the sub-pixels PX include the light-emitting units 230, and the sub-pixels PX and the light-emitting units 230 are disposed in one-to-one correspondence. Different drive units 110 are connected to different scan signal lines or data signal lines. The drive unit 110 may include one or more pixel drive circuits 111. When the drive unit 110 includes a plurality of pixel drive circuits 111, the plurality of pixel drive circuits 111 of the same drive unit 110 are disposed corresponding to the same sub-pixel PX, and the plurality of pixel drive circuits 111 of the same drive unit 110 are connected to the same data signal line and the same scan signal line, and the plurality of pixel drive circuits 111 of the same drive unit 110 are driven by the same signal.

In one embodiment, each first electrode 410 is disposed corresponding to a respective pixel opening 220, and the first electrode 410 is configured to drive the light-emitting unit 230 to emit light. A part of the first electrode 410 is exposed by the pixel opening 220, and another part of the first electrode 410 is located between the pixel defining portion 210 and the substrate 100.

The first electrode 410 may have a multi-layer structure. For example, the first electrode 410 includes a reflective layer and a pair of conductive oxide layers for covering an upper surface and a lower surface of the reflective layer, respectively. The reflective layer may be formed from a metallic material having excellent light-reflecting properties, such as silver. Each conductive oxide layer may be formed of a transparent conductive oxide, such as indium tin oxide (ITO), indium zinc oxide (IZO), or indium gallium zinc oxide (IGZO). The second electrode 510 may be formed of a metallic material, such as a magnesium-silver (MgAg) alloy.

The material of the pixel defining layer 200 may be provided in various ways. For example, the pixel defining layer 200 may be made of an inorganic material. For example, the pixel defining layer 200 is made of at least one inorganic insulating material selected from silicon nitride (SiNx), silicon oxide (SiOx), and silicon oxynitride (SiON).

Figure 6:
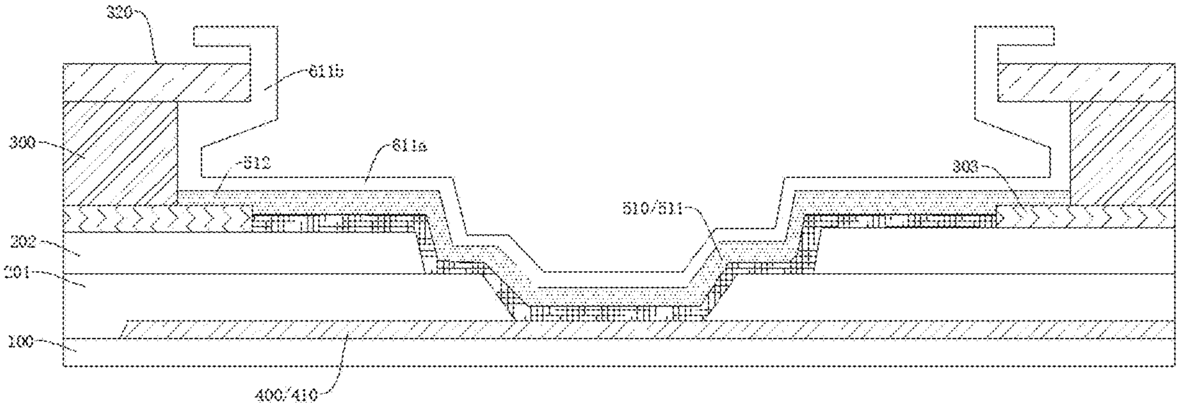
FIG. 6 is a partial cross-sectional view of FIG. 3 according to another example.

In one embodiment, as shown in FIG. 6, the pixel defining layer 200 includes a plurality of sublayers. The pixel defining layer 200 includes a first defining layer 201 and a second defining layer 202 stacked sequentially in a direction away from the substrate 100, that is, the pixel defining layer 200 may adopt a dual-layer configuration.

By way of example, the first defining layer 201 exhibits better film-forming properties than the second defining layer 202. That is, under the same thickness condition, the first defining layer 201 can better cover the stepped structure formed by the first electrode 410 compared to the second defining layer 202, without producing cracks. Conversely, to achieve the same step coverage, the first defining layer 201 is required to have a smaller thickness than the second defining layer 202, that is, the thickness of the first defining layer 201 is required to be relatively low, which is conducive to a thinner product design. Furthermore, superior film-forming properties are reflected in better coverage and higher density of the formed film, which is more effective for blocking moisture. That is, the material density of the first defining layer 201 is higher than the material density of the second defining layer 202.

By way of example, the second defining layer 202 exhibits better etch resistance than the first defining layer 201. Since the side of the pixel defining layer 200 facing away from the substrate 100 may be etched during the preparation of the display panel 10, selecting a material with higher etch resistance for the second defining layer 202 can enhance the etch resistance of the pixel defining layer 200, thereby further enhancing the reliability of the display panel 10.

By way of example, the first defining layer 201 and the second defining layer 202 are formed from different materials. For example, the material of the first defining layer 201 includes silicon nitride, and the material of the second defining layer 202 includes silicon oxide.

By way of example, the thickness of the first defining layer 201 is greater than or equal to 1000 μm and less than or equal to 5000 μm. For example, the thickness of the first defining layer 201 may be 1000 μm, 2000 μm, 3000 μm, 4000 μm, 5000 μm, etc.

By way of example, the thickness of the second defining layer 202 is greater than or equal to 500 μm and less than or equal to 3000 μm. For example, the thickness of the second defining layer 202 may be 500 μm, 1000 μm, 2000 μm, 3000 μm, etc.

In some embodiments, the isolation structure 300 includes a first sublayer 301 and a second sublayer 302 stacked in the direction away from the substrate 100, and the second sublayer 302 protrudes toward the isolation opening 310 relative to the first sublayer 301.

In these embodiments, the isolation structure 300 includes the first sublayer 301 and the second sublayer 302, and the second sublayer 302 protrudes toward the isolation opening 310 relative to the first sublayer 301 and a recess may be formed under the second sublayer 302. During the preparation of the light-emitting units 230, the light-emitting material can break at the edges of the second sublayer 302, thereby forming mutually independent light-emitting units 230.

In one embodiment, the isolation structure 300 further includes a third sublayer 303. The third sublayer 303 is located on the side of the first sublayer 301 facing the substrate 100, and the third sublayer 303 protrudes toward the isolation opening 310 relative to the first sublayer 301. During the preparation of the isolation structure 300, when the first sublayer 301 undergoes lateral etching, the third sublayer 303 can protect the film layer on the side facing the substrate 100.

In one embodiment, the first sublayer 301 and the second sublayer 302 are made of different materials, and the etching rate of the first sublayer 301 is lower than the etching rate of the second sublayer 302. The material of the first sublayer 301 includes a conductive material, which may specifically include at least one of aluminum (Al), an aluminum alloy or copper. The aluminum alloy may include at least one of an aluminum-neodymium alloy (AlNd), an aluminum-yttrium alloy (AlY), or an aluminum-silicon alloy (AlSi). The second sublayer 302 may be of a single-layer structure or a multi-layer structure. When the second sublayer 302 is of a single-layer structure, the material of the second sublayer 302 may include at least one of titanium, titanium nitride, molybdenum, tungsten, a molybdenum-tungsten alloy, or a molybdenum-niobium alloy. When the second sublayer 302 is of a multi-layer structure, one layer of the second sublayer 302 may include at least one of titanium, titanium nitride, molybdenum, tungsten, a molybdenum-tungsten alloy, or a molybdenum-niobium alloy, and another layer of the second sublayer 302 may include a conductive oxide or an inorganic insulating material. The conductive oxide may be, for example, indium tin oxide (ITO) or indium zinc oxide (IZO).

In one embodiment, the material of the third sublayer 303 includes a conductive material. For example, the material of the third sublayer 303 may include at least one of molybdenum (Mo), titanium (Ti), titanium nitride (TiN), a molybdenum-tungsten alloy (MoW), or a molybdenum-niobium alloy (MoNb).

Figure 3:
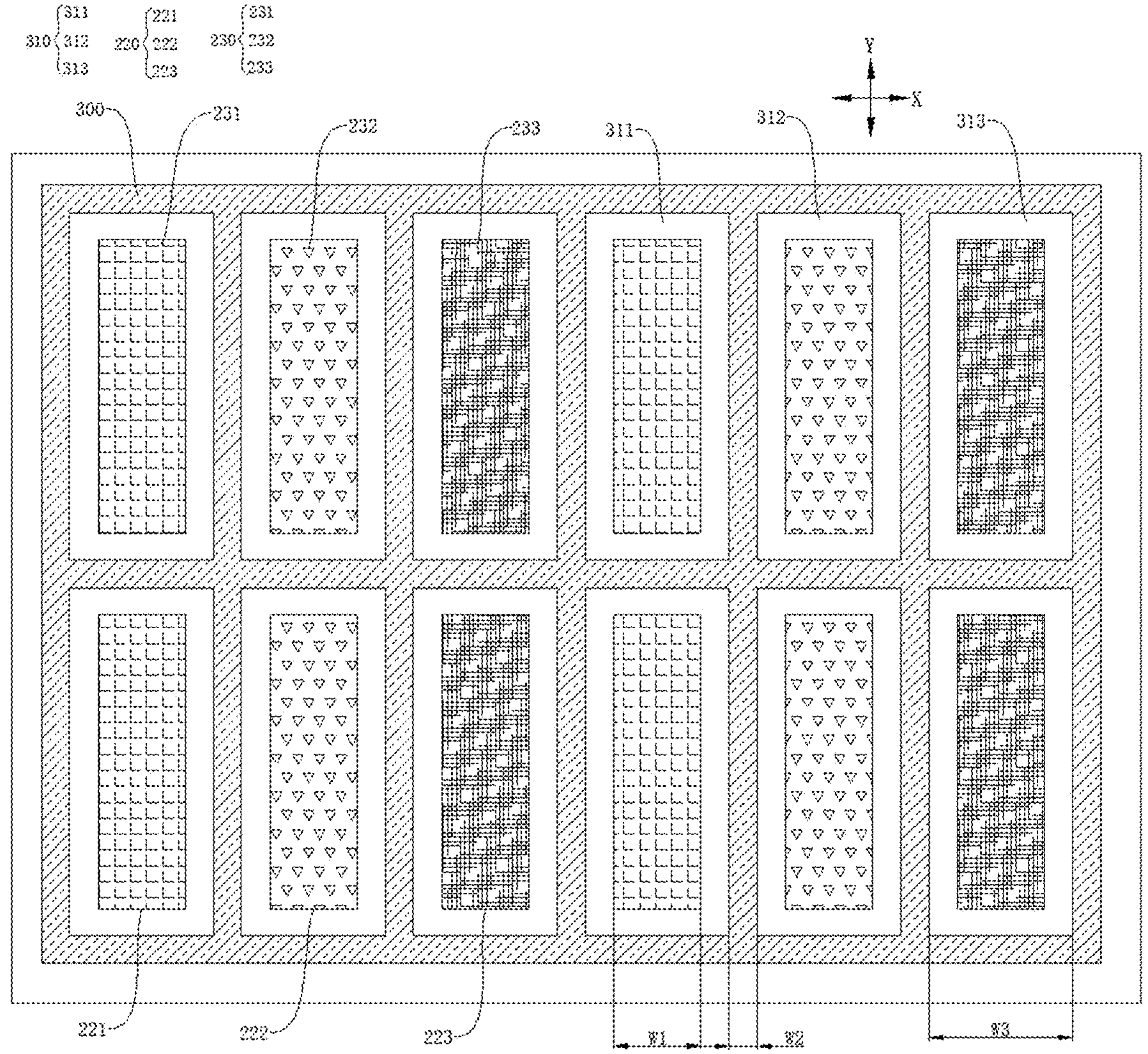
FIG. 3 is a structural schematic partial enlarged view of FIG. 1.

In one embodiment, as shown in FIGS. 3 and 4, the display panel 10 further includes a second electrode layer 500. The second electrode layer 500 includes a second electrode 510 located on a side of each light-emitting unit 230 facing away from the substrate 100. In one embodiment, the light-emitting device includes the first electrode 410, the light-emitting unit 230, and the second electrode 510 as described above. In one embodiment, a second electrode 510 is located in each isolation opening 310. In one embodiment, the second electrode 510 is electrically connected to the isolation structure 300. For example, the material of the first sublayer 301 includes a conductive material, and the second electrode 510 is electrically connected to the first sublayer 301. Alternatively, the materials of the first sublayer 301 and the third sublayer 303 each include a conductive material, and the second electrode 510 is electrically connected to the third sublayer 303 and the first sublayer 301.

In one embodiment, at least one light-emitting unit 230 includes a hole injection layer HIL, a hole transport layer HTL, an electron blocking layer EBL, a light-emitting material layer EML, a hole blocking layer HBL, an electron transport layer ETL, and an electron injection layer EIL which are stacked in the direction away from the substrate 100 (in the thickness direction Z). The light-emitting unit 230 may include one light-emitting material layer EML, or a tandem light-emitting structure including a plurality of light-emitting material layers EML.

During the light-emitting process of the light-emitting unit 230, the first electrode 410 is configured to generate holes, and the second electrode 510 is configured to generate electrons. The holes and electrons recombine within the light-emitting unit 230, causing the light-emitting unit 230 to emit light. The first electrode 410 is in contact with the light-emitting unit 230, and part of the light-emitting unit 230 may be connected in an overlapping manner to the isolation structure 300, which may result in crosstalk of holes between adjacent light-emitting units 230 via the light-emitting units 230 and the isolation structure 300. In the embodiments of the present application, the pixel defining portion 210 is provided with a recess, causing at least part of the light-emitting unit 230 to fracture at the recess, thereby reducing the hole transport area and mitigating the problem of lateral crosstalk.

In order for the light-emitting unit 230 to emit light, a pixel voltage is provided to the first electrode 410 and a common voltage is provided to the second electrode 510. A potential difference is formed between the first electrode 410 and the second electrode 510, causing the light-emitting structure disposed between the first electrode 410 and the second electrode 510 to emit light. In one embodiment, when a potential difference is formed between the first electrode 410 and the second electrode 510 of the light-emitting unit 230, the light-emitting material layer EML of the light-emitting unit 230 emits light.

The pixel voltage of the first electrode 410 is supplied by the pixel drive circuit 111, and the common voltage of the second electrode 510 is supplied by the isolation structure 300. In particular, the second electrode 510 is electrically connected to the isolation structure 300, and the common voltage applied to the isolation structure 300 is thereby supplied to the second electrode 510. That is, the isolation structure 300 serves to supply the common voltage to the second electrode 510.

The display panel 10 further includes a first encapsulation layer 610. The first encapsulation layer 610 includes a plurality of encapsulation portions 611. The encapsulation portion 611 is located on a side of the second electrode 510 facing away from the substrate 100, passes through a side wall of the isolation structure 300, and extends to a side of the isolation structure 300 facing away from the substrate 100.

By way of example, as shown in FIG. 4, the encapsulation portion 611 includes a first section **611*a* and a second section 611*b* that are connected to each other. The first section 611*a* is located within the isolation opening 310 and disposed on a side of the light-emitting unit 230 facing away from the substrate 100, and the second section 611*b* is located on a side of the isolation structure 300 facing the isolation opening 310. A surface of a side of the first section 611***a* facing away from the substrate 100 and a surface of a side of the second section 611*b* facing away from the isolation structure 300 are at least partially connected to enclose a void space.

By way of example, as shown in FIG. 6, the surface of the side of the first section 611*a* facing away from the substrate 1 and the surface of the side of the second section 611*b* facing away from the isolation structure 300 may alternatively be disconnected.

In some embodiments, as shown in FIGS. 1 to 7, the drive unit 110 includes one pixel drive circuit 111, the pixel drive circuit 111 including two or more drive transistors T1, and the two or more drive transistors T1 of the pixel drive circuit 111 connected to the same first electrode 410 being connected in parallel.

In these embodiments, the drive capability of the pixel drive circuit 111 and the current of the drive unit 110 are increased by increasing the number of drive transistors T1 of the pixel drive circuit 111, thereby improving the display effect without the need for increasing the number of pixel drive circuits 111, and the structure of the drive unit 110 of the display panel 10 can be simplified.

When the pixel drive circuit 111 includes two drive transistors T1, the two drive transistors T1 are connected to the same first electrode 410, and the two or more drive transistors T1 connected to the same first electrode 410 are electrically connected to the first electrode 410 by the same first communication hole 121. In this way, the number of holes in the planarization layer 120 is reduced, and the preparation of the planarization layer 120 is simplified.

In one embodiment, as shown in FIG. 4, in the same pixel drive circuit 111, the sources or the drains of the two drive transistors T1 are connected to the first electrode 410 by the same first communication hole 121.

In some other embodiments, as shown in FIGS. 2 and 8 to 10, the drive unit 110 includes two or more pixel drive circuits 111. Each pixel drive circuit 111 includes one drive transistor T1, and the drive transistors T1 of the two or more pixel drive circuits 111 are connected to the same first electrode 410.

In these embodiments, the drive effect of the drive unit 110 can be ensured by increasing the number of pixel drive circuits 111 without changing the structure of the original pixel drive circuit 111.

Figure 9:
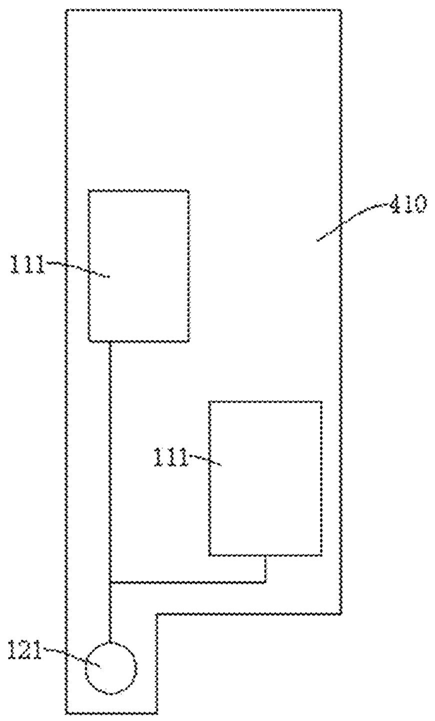
FIG. 9 is a structural schematic diagram of the relative positional relationship between a pixel drive circuit and a first electrode of a display panel according to an embodiment of the present application.
Figure 10:
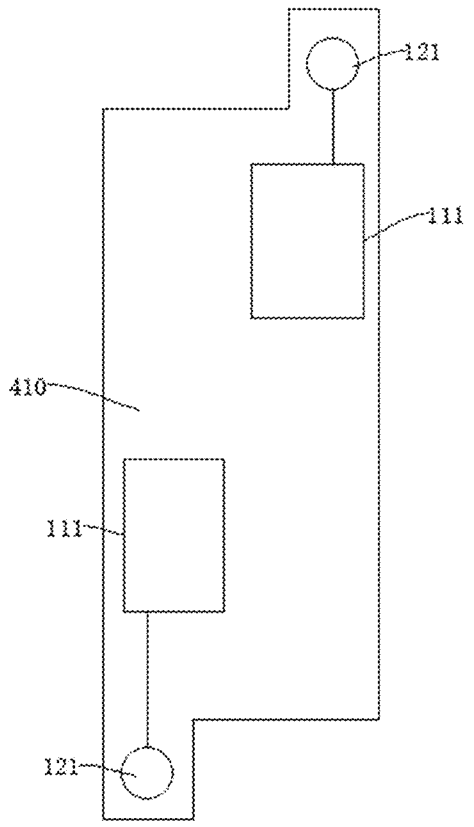
FIG. 10 is a structural schematic diagram of the relative positional relationship between a pixel drive circuit and a first electrode of a display panel according to another embodiment of the present application.

When the same drive unit 110 includes two or more pixel drive circuits 111, as shown in FIG. 9, the drive transistors T1 of the two or more pixel drive circuits 111 are connected to the same first electrode 410 by the same first communication hole 121, to simplify the preparation of the planarization layer 120. Alternatively, as shown in FIG. 10, the first electrode 410 is disposed corresponding to two or more first communication holes 121, and orthographic projections on the base substrate 100*a* of the two or more first communication holes 121 corresponding to the same first electrode 410 are spaced apart on a peripheral side of the orthographic projection of the first electrode 410 on the base substrate 100*a*, and the two or more pixel drive circuits 111 connected to the same first electrode 410 and the first communication holes 121 are disposed in one-to-one correspondence. In this way, the provision of first communication holes 121 in different positions according to the structure of the pixel drive circuit 111 is facilitated, and the shortening of the length of a connection path of the first electrode 410 and the drive transistor T1 is facilitated.

Figure 11:
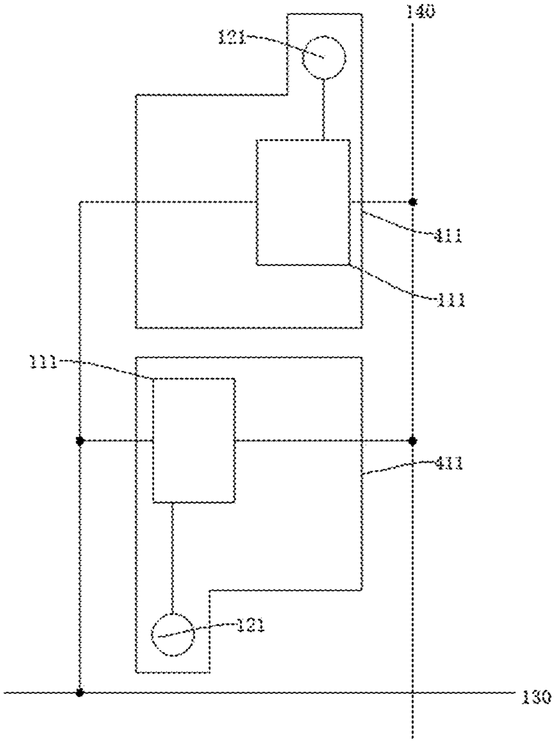
FIG. 11 is a structural schematic diagram of the relative positional relationship between a pixel drive circuit and a first electrode of a display panel according to still another embodiment of the present application.

In still some embodiments, as shown in FIG. 11, the first electrode 410 includes two or more sub-electrodes 411, and the drive unit 110 includes two or more pixel drive circuits 111. Each pixel drive circuit 111 includes one of the drive transistors T1, the sub-electrodes 411 and the pixel drive circuits 111 are disposed in one-to-one correspondence, each sub-electrode 411 is disposed corresponding to the first communication hole 121, and the drive transistor T1 of each pixel drive circuit 111 is electrically connected to the sub-electrode 411 by the first communication hole 121.

In these embodiments, the same first electrode 410 is divided into a plurality of sub-electrodes 411, and the sub-electrodes 411, the pixel drive circuits 111, the drive transistors T1, and the first communication holes 121 are disposed in one-to-one correspondence, and the connection yield between the pixel drive transistor T1 and the sub-electrode 411 can be improved, thereby improving the display effect. Moreover, when one of the plurality of sub-electrodes 411 of the first electrode 410 is poorly prepared, the other sub-electrodes 411 are not susceptible to influence.

The first electrodes 410 and the light-emitting units 230 are disposed in one-to-one correspondence, and the sub-pixel PX includes one first electrode 410.

There are a variety of ways to set the number of sub-electrodes 411 included in the first electrode 410. As shown in FIG. 11, in some embodiments, the first electrode 410 includes two sub-electrodes 411, the two sub-electrodes 411 of the same first electrode 410 being spaced apart in a second direction Y, and two first communication holes 121 corresponding to the two sub-electrodes 411 of the same first electrode 410 are located on opposite sides of the two sub-electrodes in the second direction Y.

In these embodiments, in the same first electrode 410, the first communication holes 121 corresponding to the two sub-electrodes 411 are located on the sides away from each other rather than between two adjacent sub-electrodes 411, facilitating a reduction in the spacing between the two sub-electrodes 411 of the first electrode 410 as required, thereby improving the light extraction effect of the same light-emitting unit 230.

In some embodiments, as shown in FIGS. 2 to 4 and 11, the substrate 100 further includes first signal lines 130 extending in a first direction X and second signal lines 140 extending in a second direction Y. A plurality of pixel drive circuits 111 connected to a plurality of sub-electrodes 411 of the same first electrode 410 are connected to the same first signal line 130 and the same second signal line 140. The first signal line 130 includes at least one of a scan signal line and a light emission control signal line, and the second signal line 140 includes a data signal line.

In these embodiments, the plurality of pixel drive circuits 111 included in the same drive unit 110 are connected to the same first signal line 130 and the second signal line 140, and the plurality of pixel drive circuits 111 of the same drive unit 110 are driven by the same signal, and the circuit structure of the display panel 10 is simplified.

In one embodiment, when the first signal line 130 includes a scan signal line, the scan signal line may be configured in a variety of ways. For example, the same drive unit 110 corresponds to one scan signal line, and the plurality of pixel drive circuits 111 included in the same drive unit 110 are connected to the same scan signal line. Alternatively, the same drive unit 110 is disposed corresponding to a plurality of scan signal lines. For example, the plurality of scan signal lines include a first scan signal line and a second scan signal line, and the plurality of pixel drive circuits 111 of the same drive unit 110 are connected to the same first scan signal line and second scan signal line.

Figure 12:
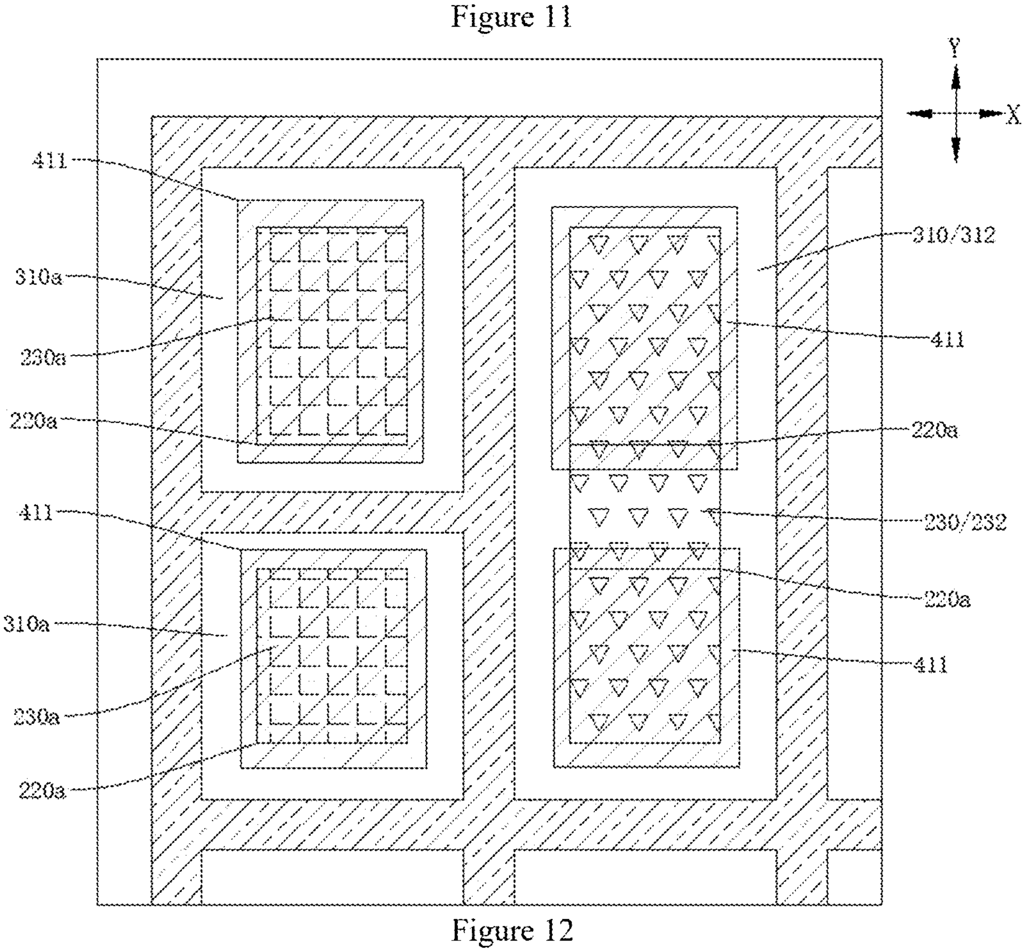
FIG. 12 is a structural schematic partial enlarged view of FIG. 3.
Figure 13:
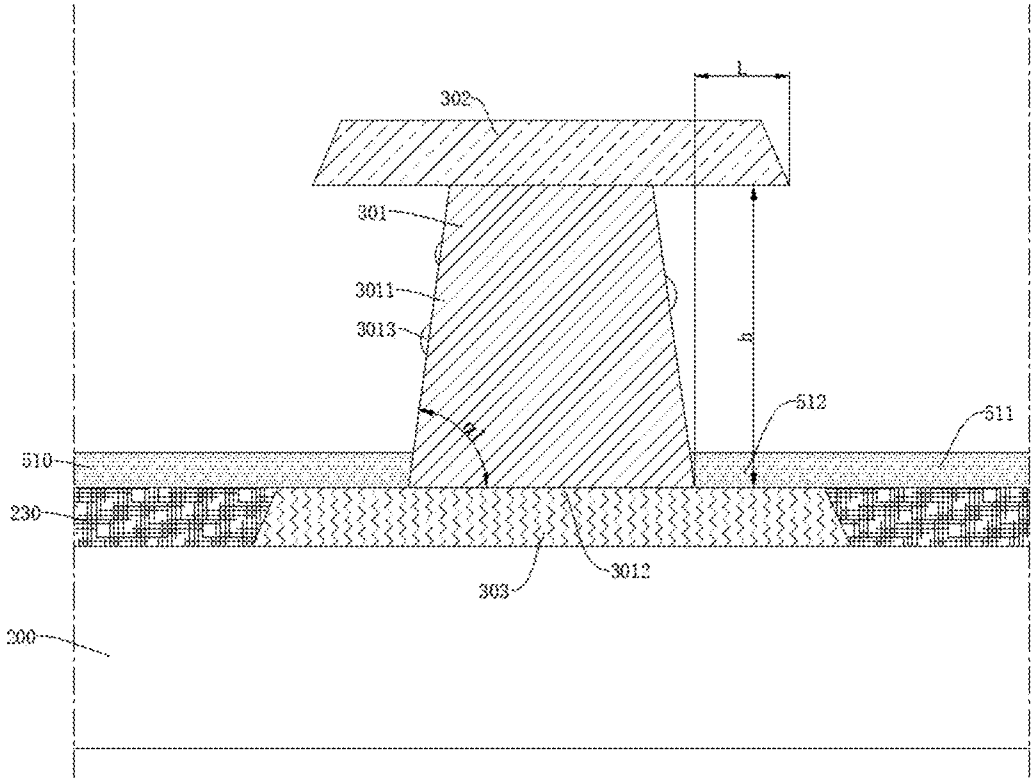
FIG. 13 is a structural schematic partial enlarged view of FIG. 4.
Figure 14:
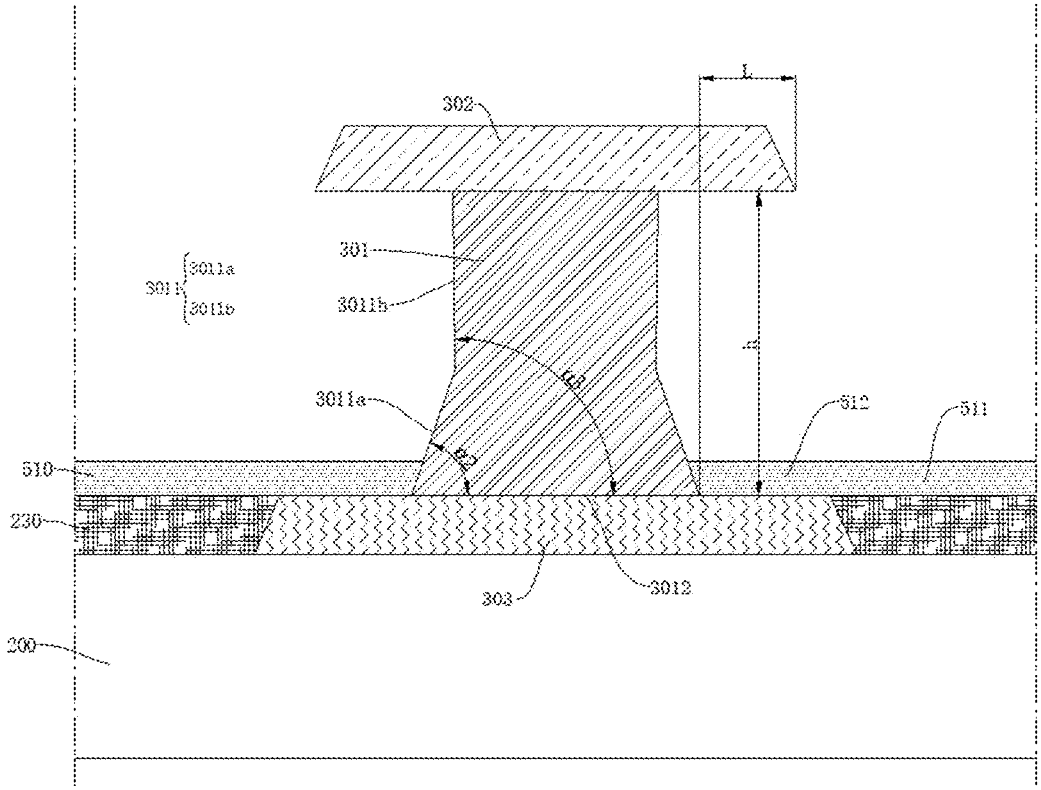
FIG. 14 is a structural schematic partial enlarged view of FIG. 4 in another example.
Figure 15:
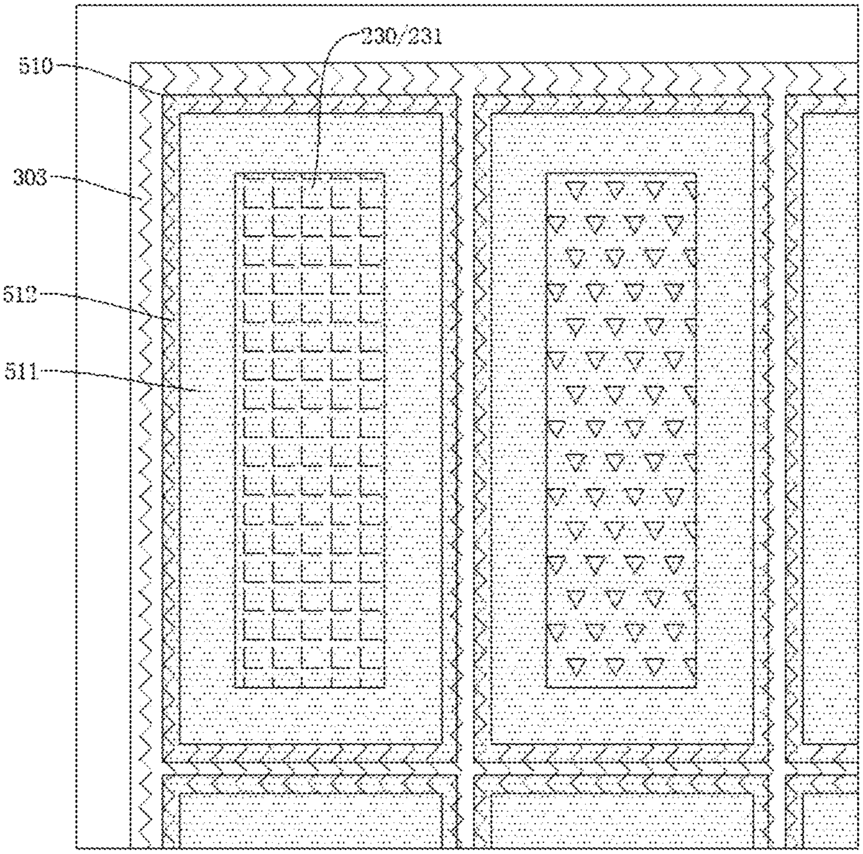
FIG. 15 is a structural schematic partial enlarged view of FIG. 3 in another example.

In one embodiment, as shown in FIGS. 11 to 12, when the first electrode 410 is divided into a plurality of sub-electrodes 411, the light-emitting unit 230 may be divided into a plurality of sub-light-emitting units 230*a*, or the light-emitting unit 230 is not divided, but the same light-emitting unit 230 is disposed corresponding to the plurality of sub-electrodes 411 of the same first electrode 410. For example, as shown in FIG. 12, in some embodiments, the light-emitting unit 230 includes two or more sub-light-emitting units 230*a*, the sub-light-emitting units 230*a* and the sub-electrodes 411 being disposed in one-to-one correspondence, the pixel opening 220 includes two or more first sub-openings 220*a*, at least part of the sub-light-emitting unit 230*a* being located in the first sub-opening 220*a*, and the isolation opening 310 includes two or more second sub-openings 310*a*, each sub-light-emitting unit 230*a* being located in a respective second sub-opening 310*a*.

In these embodiments, the sub-electrodes 411, the sub-light-emitting units 230*a*, the first sub-openings 220*a*, and the second sub-openings 310*a* are disposed in one-to-one correspondence, and a failure in one of the sub-light-emitting units 230*a* will not cause failures in the other sub-light-emitting units 230*a*.

In some other embodiments, as shown in FIG. 12, the pixel opening 220 includes two or more first sub-openings 220*a*. The first sub-openings 220*a* and the sub-electrodes 411 are disposed in one-to-one correspondence, the two or more first sub-openings 220*a* are disposed corresponding to the same isolation opening 310, and at least parts of the light-emitting unit 230 within the same isolation opening 310 are located in the two or more first sub-openings 220*a*.

In these embodiments, the sub-electrodes 411 and the first sub-openings 220*a* are disposed in one-to-one correspondence, and each sub-electrode 411 is exposed by a respective first sub-opening 220*a* and is in contact with the light-emitting unit 230. However, the light-emitting unit 230 and the isolation opening 310 are not divided, and it is possible to simplify the preparation of the isolation structure 300 and the light-emitting unit 230, simplify the preparation process of the isolation structure 300 and the light-emitting unit 230, and improve the preparation efficiency of the display panel 10.

In one embodiment, when the first electrode 410 is not divided into a plurality of sub-electrodes 411, the light-emitting unit 230, the pixel opening 220 and the isolation opening 310 may be divided to form the sub-light-emitting units 230*a*, the first sub-openings 220*a* and the second sub-openings 310*a* as described above, or the light-emitting units 230, the pixel openings 220, the isolation openings 310 and the first electrodes 410 are disposed in one-to-one correspondence and are not divided. This will not be limited in the present application.

In some embodiments, reference is made to the above, as shown in FIGS. 1 to 4 and 13, the material of the first sublayer 301 includes copper, and the first side surface 3011 is a flat surface or a curved surface with a smooth transition. When the material of the first sublayer 301 includes copper, the first sublayer 301 may be prepared in the same wet etching process step, and the first side surface 3011 is smoother and the first side surface 3011 is a flat surface or a curved surface with a smooth transition.

In some other embodiments, as shown in FIGS. 1 to 4 and 14, the material of the first sublayer 301 includes aluminum, and the first side surface 3011 includes a first subsurface 3011*a* and a second subsurface 3011*b* connected to each other in a direction away from the substrate 100, the first subsurface 3011*a* intersecting the second subsurface 3011*b*.

In these embodiments, when the material of the first sublayer 301 includes aluminum, the aluminum can be both dry and wet etched, and the first sublayer 301 may be prepared to form the first subsurface 3011*a* and the second subsurface 3011*b* in two process steps.

In one embodiment, as shown in FIGS. 1 to 4 and 13, the first sublayer 301 includes a first bottom surface 3012 facing the base substrate 100*a*. When the material of the first sublayer 301 includes copper, a first included angle $\alpha 1$ is formed between the first side surface 3011 and the first bottom surface 3012. The first angle $\alpha 1$ ranges from 40° to 85°. In one embodiment, the first bottom surface 3012 is parallel to the surface of the substrate 100, and the included angle between the extension plane of the first side surface 3011 and the surface of the substrate 100 ranges from 40° to 85°. The larger first included angle $\alpha 1$ facilitates the formation of a larger space under the second sublayer 302, and facilitates the isolation structure to isolate the light-emitting unit.

In some other embodiments, as shown in FIGS. 1 to 4 and 14, when the material of the first sublayer 301 includes aluminum, and the first side surface 3011 includes a first subsurface 3011*a* and a second subsurface 3011*b*, a second included angle $\alpha 2$ is formed between the first subsurface 3011*a* and the first bottom surface 3012, and a third included angle $\alpha 3$ is formed between an extension plane of the second subsurface 3011*b* and an extension plane of the first bottom surface 3012. The second included angle $\alpha 2$ is less than the third included angle $\alpha 3$.

In these embodiments, when the second included angle $\alpha 2$ is less than the third included angle $\alpha 3$, the formation of a recess on the first side surface is facilitated, and the third included angle $\alpha 3$ between the second subsurface 3011*b* adjacent to the second sublayer 302 and the first bottom surface 3012 is relatively large, thereby facilitating the formation of a relatively large recessed space under the second sublayer 302.

In one embodiment, a difference between the third included angle $\alpha 3$ and the second included angle $\alpha 2$ ranges from 2° to 20°, to alleviate the problem of the formation of the first subsurface 3011*a* and the second subsurface 3011*b* being affected caused by too large or too small difference between the third included angle $\alpha 3$ and the second included angle $\alpha 2$.

The second sublayer 302 protrudes toward the isolation opening 310 relative to the first sublayer 301 by a first distance L, a plurality of light-emitting units 230 include a first light-emitting unit 231 and a second light-emitting unit 232 of different light-emitting colors, and the isolation openings 310 include a first isolation opening 311 for receiving the first light-emitting unit 231 and a second isolation opening 312 for receiving the second light-emitting unit 232. In one embodiment, the first distance L may be the minimum distance between an edge of an orthographic projection of the first sublayer 301 on the substrate 100 and an edge of an orthographic projection of the second sublayer 302 on the substrate 100.

When the material of the first sublayer 301 includes copper, as shown in FIGS. 1 to 4 and 13, the first distance L corresponding to the first isolation opening 311 is equal to the first distance L corresponding to the second isolation opening 312. The first distance L corresponding to the first isolation opening 311 is a distance by which the second sublayer 302 protrudes toward the first isolation opening 311 relative to the first sublayer 301. Correspondingly, the first distance L corresponding to the second isolation opening 312 may be a distance by which the second sublayer 302 protrudes toward the second isolation opening 312 relative to the first sublayer 301.

During the process of preparing the first light-emitting unit 231 using the isolation structure 300, first, a whole layer of a material for preparing the first light-emitting unit 231 is disposed in the first isolation opening 311 and the second isolation opening 312, and the material for preparing the first light-emitting unit 231 within the second isolation opening 312 is then removed. In these embodiments, when the material of the first sublayer 301 includes copper, due to the characteristics of the copper material itself, when the material for preparing the first light-emitting unit 231 within the second isolation opening 312 is removed, the first sublayer 301 is less affected, and the first distance L corresponding to the first isolation opening 311 and the first distance L corresponding to the second isolation opening 312 are equal within the process preparation error range.

In some other embodiments, as shown in FIGS. 1 to 4 and 14, when the material of the first sublayer 301 includes aluminum, the first distance L corresponding to the first isolation opening 311 is different from the first distance L corresponding to the second isolation opening 312. When the material of the first sublayer 301 includes aluminum, the first sublayer 301 may be affected when the material for preparing the first light-emitting unit 231 within the second isolation opening 312 is removed, and the first distance L corresponding to the first isolation opening 311 is therefore different from the first distance L corresponding to the second isolation opening 312.

When the material of the first sublayer 301 includes copper, as shown in FIGS. 1 to 4 and 13, the first distance L ranges from 0.8 μm to 1.6 μm. For example, the first distance L is 0.8 μm, 0.9 μm, 1.3 μm, 1.5 μm, 1.6 μm, etc.; or the first sublayer 301 has a first height h, and a ratio of the first distance L to the first height h ranges from 0.75 to 2. When the material of the first sublayer 301 includes copper, the value of the first distance L is relatively large to ensure the dividing effect of the isolation structure 300 on the light-emitting material.

In one embodiment, the material of the first sublayer 301 includes aluminum, as shown in FIGS. 1 to 4 and 14, the first distance L ranges from 0.7 μm to 1.1 μm. For example, the first distance L is 0.7 μm, 0.75 μm, 0.8 μm, 1.0 μm, 1.1 μm, etc.; or the first sublayer 301 has a first height h, and a ratio of the first distance L to the first height h ranges from 0.8 to 1.3. When the material of the first sublayer 301 includes aluminum, the value of the first distance L is slightly smaller, to prevent the first distance L from becoming too large during the etching of the first sublayer 301 in the subsequent preparation of the light-emitting unit 230, thereby ensuring the structural stability of the isolation structure 300.

In some embodiments, as shown in FIGS. 1 to 4 and 13, when the material of the first sublayer 301 includes copper, the first side surface 3011 facing at least one of the isolation openings 310 is provided with a plurality of spaced-apart covering portions 3013, a material of the covering portion 3013 including copper oxide. When the material of the first sublayer 301 includes copper, exposure of the first sublayer 301 to air will form copper oxide black dots, and the plurality of covering portions 3013 are spaced apart rather than distributed on the entire surface. When the second electrode 510 is connected to the first side surface 3011 in an overlapping manner, current can be transmitted between the second electrode 510 and the first side surface 3011.

In one embodiment, when the material of the first sublayer 301 includes copper, the light-emitting unit 230 is in contact with and connected to the first sublayer 301; or the isolation structure 300 further includes a third sublayer 303 located on a side of the first sublayer 301 facing the base substrate 100*a*, the third sublayer 303 protruding toward the isolation opening 310, the light-emitting unit 230 being in contact with and connected to the third sublayer 303, and the light-emitting unit 230 is spaced apart from the first sublayer 301.

In these embodiments, when the isolation structure 300 includes no third sublayer 303, an edge of the light-emitting unit 230 may be in contact with the first sublayer 301; and when the isolation structure 300 includes the third sublayer 303, the light-emitting unit 230 may be in contact with the third sublayer 303, and the light-emitting unit 230 is spaced apart from the first sublayer 301.

In some embodiments, as shown in FIGS. 1 to 4 and 13 to 15, when the display panel 10 includes the third sublayer 303 and the second electrode 510 as described above, the second electrode 510 includes a main portion 511 and a contact portion 512 in the form of a closed ring surrounding the main portion 511. The contact portion 512 is in contact with and connected to the third sublayer 303.

In these embodiments, the contact portion 512 is in the form of a closed ring, and the contact portion 512 in different orientations of the main portion 511 is in contact with and connected to the third sublayer 303. For example, an orthographic projection of the contact portion 512 on the substrate 100 at least partially overlaps an orthographic projection of the third sublayer 303 on the substrate 100 to form an overlapping region. The overlapping region is in the form of a closed ring surrounding the main portion 511, and edges of the second electrode 510 can all be in contact with and connected to the third sublayer 303, and the overlapping connection area of the second electrode 510 and the isolation structure 300 can be increased to reduce the overlapping connection resistance, and the display panel 10 is more suitable for large-screen display devices such as televisions.

In some embodiments, as shown in FIG. 3, in a same direction, a width of the orthographic projection of the pixel opening 220 on the base substrate 100*a* is defined as a first width W1, a spacing between orthographic projections of two adjacent isolation openings 310 on the base substrate 100*a* is defined as a second width W2, and the first width W1 is greater than the second width W2 and less than or equal to 124 times the second width W2.

In these embodiments, the width dimension of the pixel opening 220 being greater than the spacing between the orthographic projections of the two adjacent isolation openings 310 on the base substrate 100*a* enables the aperture ratio of the display panel 10 to be increased, and the display panel 10 is suitable for large-screen display devices such as televisions.

In one embodiment, the light-emitting units 230 include a first light-emitting unit 231, a second light-emitting unit 232 and a third light-emitting unit 233, and the pixel openings 220 include a first pixel opening 221 for receiving the first light-emitting unit 231, a second pixel opening 222 for receiving the second light-emitting unit 232, and a third pixel opening 223 for receiving the third light-emitting unit 233.

In one embodiment, the second width W2 may be the distance between the orthographic projections of any two adjacent isolation openings 310 on the base substrate 100*a*. As described above, the isolation structure 300 includes a first sublayer 301 and a second sublayer 302, and the second width W2 may be the width of the first sublayer 301 or the width of the second sublayer 302 between any two adjacent isolation openings 310. When the isolation structure 300 includes the third sublayer 303 described above, the second width W2 may also be the width of the third sublayer 303 between any two adjacent isolation openings 310. As shown in FIG. 4, in an embodiment of the present application, the width of the second sublayer 302 between any two adjacent isolation openings 310 is used as the second width W2. The second sublayer 302 has a relatively large influence on the aperture ratio and the resolution of the display panel 10. By using the width of the second sublayer 302 as the second width W2, and properly setting the second width W2 and the third width W3, the display panel 10 can be more adapted to large-size display devices.

In one embodiment, the orthographic projection of the pixel opening 220 on the base substrate 100*a* has a first width W1. The first width W1 may be a distance between two intersection points of edges of the orthographic projection of the pixel opening 220 on the base substrate and a straight line passing through the centroid of the orthographic projection of the pixel opening 220 on the base substrate 100*a*. In one embodiment, the pixel opening 220 is enclosed by a side surface of the pixel defining portion 210 facing the pixel opening 220, and the size of the pixel opening 220 gradually increases in the direction away from the substrate 100. The pixel defining portion 210 has a bottom surface facing the substrate 100 and a top surface facing away from the substrate 100, the orthographic projection of the pixel opening 220 on the base substrate 100*a* may be enclosed by edges of the bottom surface of the pixel defining portion 210, or the orthographic projection of the pixel opening 220 on the base substrate 100*a* may be enclosed by edges of the top surface of the pixel defining portion 210, or the orthographic projection of the pixel opening 220 on the base substrate 100*a* is enclosed by the side surface of the pixel defining portion 210 facing the pixel opening 220 at an arbitrary position. The embodiments of the present application are illustrated by taking an example where the orthographic projection of the pixel opening 220 on the base substrate 100*a* is enclosed by the bottom surface of the pixel defining portion 210. A region enclosed by the bottom surface constitutes a contact area, i.e., an effective light-emitting region, of the light-emitting unit 230 and the first electrode 410 within the pixel opening 220. The orthographic projection of the pixel opening 220 on the base substrate 100*a* being enclosed by the bottom surface of the pixel defining portion 210 can better design the effective light-emitting area of the pixel opening 220.

In one embodiment, the orthographic projection of the isolation opening 310 on the base substrate 100*a* has a third width W3, and the orthographic projection of the isolation opening 310 on the base substrate 100*a* may be enclosed by the side surface of the first sublayer 301 or the second sublayer 302 facing the isolation opening 310. For example, as shown in FIG. 3, the orthographic projection of the isolation opening 310 on the base substrate 100*a* is enclosed by the side surface of the second sublayer 302 facing the isolation opening 310, and the third width W3 of the isolation opening 310 may be the width of the orthographic projection on the base substrate 100*a* of the side surface of the second sublayer 302 facing the isolation opening 310. In one embodiment, the third width W3 may be a distance between the two intersection points of edges of the orthographic projection of the isolation opening 310 on the base substrate 100*a* and a straight line passing through the centroid of the orthographic projection of the isolation opening 310 on the base substrate 100*a*.

The third width W3 is greater than or equal to 2 times the second width W2 and less than or equal to 125 times the second width W2, which may be meant that the minimum value of the third width W3 is greater than or equal to 2 times the maximum value of the second width W2, and the maximum value of the third width W3 is greater than or equal to 125 times the maximum value of the second width W2.

In one embodiment, as shown in FIG. 3, a plurality of first light-emitting units 231 are arranged sequentially at intervals in the second direction Y to form a first pixel column, a plurality of second light-emitting units 232 are arranged sequentially at intervals in the second direction Y to form a second pixel column, and a plurality of third light-emitting units 233 are arranged sequentially at intervals in the second direction Y to form a third pixel column. The first pixel column, the second pixel column, and the third pixel column are arranged sequentially alternately in the first direction X. In one embodiment, the extension dimension of each of the first light-emitting unit 231, the second light-emitting unit 232 and the third light-emitting unit 233 in the first direction X is less than the extension dimension thereof in the second direction Y, and the extension dimension of the light-emitting unit 230 in the first direction X is the width of the first light-emitting unit 231. Correspondingly, the extension dimension of the pixel opening 220 in the first direction X is less than the extension dimension thereof in the second direction Y, and the extension dimension of the pixel opening 220 in the first direction X is the width of the pixel opening 220.

In one embodiment, in the first direction X, the width of the orthographic projection of the pixel opening 220 on the base substrate 100*a* is the first width W1 as described above, and the distance between the orthographic projections of the two adjacent isolation openings 310 on the base substrate 100*a* is the second width W2 as described above.

In one embodiment, the second width W2 ranges from 3 μm to 6 μm, and the first width W1 is greater than 5 times the second width W2 and less than or equal to 124 times the second width W2; or the second width W2 ranges from 7 μm to 10 μm, and the first width W1 is greater than 2 times the second width W2 and less than or equal to 68 times the second width W2; or the second width W2 ranges from 11 μm to 16 μm, and the first width W1 is greater than the second width W2 and less than or equal to 47 times the second width W2.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 5 microns, for different sizes of the active area, and different resolutions and pixel densities, the width of each pixel opening 220 in the first direction X is set in the manner shown in Table 1:

TABLE 1

| Size of active area | Resolution | PPI | W2 | W1_R | W1_G | W1_B |
|---|---|---|---|---|---|---|
| 45 | 2K | 49 | 5 | 122 | 122 | 244 |
| 55 | 2K | 40 | | 151 | 151 | 303 |
| 65 | 2K | 34 | | 179 | 179 | 359 |
| 75 | 2K | 30 | | 208 | 208 | 416 |

TABLE 1-continued

| Size of active area | Resolution | PPI | W2 | W1_R | W1_G | W1_B |
|---|---|---|---|---|---|---|
| 85 | 2K | 26 | | 237 | 237 | 473 |
| 100 | 2K | 22 | | 281 | 281 | 562 |
| 110 | 2K | 20 | | 310 | 310 | 620 |
| 45 | 4K | 98 | | 57 | 57 | 115 |
| 55 | 4K | 80 | | 72 | 72 | 144 |
| 65 | 4K | 68 | | 86 | 86 | 172 |
| 75 | 4K | 59 | | 100 | 100 | 200 |
| 85 | 4K | 52 | | 115 | 115 | 229 |
| 100 | 4K | 44 | | 137 | 137 | 274 |
| 110 | 4K | 40 | | 151 | 151 | 303 |
| 45 | 8K | 196 | | 25 | 25 | 50 |
| 55 | 8K | 160 | | 32 | 32 | 64 |
| 65 | 8K | 136 | | 39 | 39 | 78 |
| 75 | 8K | 118 | | 46 | 46 | 93 |
| 85 | 8K | 104 | | 54 | 54 | 107 |
| 100 | 8K | 88 | | 65 | 65 | 129 |
| 110 | 8K | 80 | | 72 | 72 | 144 |

In Table 1, the size of the active area is in inches, for example, the display size of 45 in the table indicates that the display size is 45 inches. PPI is the pixel density. W2 is the distance in microns between the orthographic projections of two adjacent isolation openings 310 on the base substrate 100*a* in the first direction X. W1_R may be the first width W1 of the first pixel opening 221 in the first direction X, W1_G may be the width of the second pixel opening 222 in the first direction X, and W1_B may be the width of the third pixel opening 223 in the first direction X. The first width W1 is also in microns.

As can be seen from Table 1 above, when the second width W2 is 5 μm, the first width W1 is greater than 5 times the second width W2 and less than or equal to 124 times the second width W2. The first pixel opening 221 and the second pixel opening 222 have the same first width W1, the first width W1 corresponding to the first pixel opening 221 and the second pixel opening 222 is greater than 5 times the second width W2 and less than or equal to 62 times the second width W2 when the second width W2 is 5 μm. The first width W1 of the third pixel opening 223 is relatively large, and the first width W1 corresponding to the third pixel opening 223 is larger than 10 times the second width W2 and less than or equal to 124 times the second width W2 when the second width W2 is 5 μm.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 9 microns, for different sizes of the active area, and different resolutions and pixel densities, the width of each pixel opening 220 in the first direction X is set in the manner shown in Table 2:

TABLE 2

| Size of active area | Resolution | PPI | W2 | W1_R | W1_G | W1_B |
|---|---|---|---|---|---|---|
| 45 | 2K | 49 | 9 | 119 | 119 | 238 |
| 55 | 2K | 40 | | 148 | 148 | 297 |
| 65 | 2K | 34 | | 176 | 176 | 353 |
| 75 | 2K | 30 | | 205 | 205 | 410 |
| 85 | 2K | 26 | | 234 | 234 | 467 |
| 100 | 2K | 22 | | 278 | 278 | 556 |
| 110 | 2K | 20 | | 307 | 307 | 614 |
| 45 | 4K | 98 | | 54 | 54 | 109 |
| 55 | 4K | 80 | | 69 | 69 | 138 |
| 65 | 4K | 68 | | 83 | 83 | 166 |
| 75 | 4K | 59 | | 97 | 97 | 194 |
| 85 | 4K | 52 | | 112 | 112 | 223 |
| 100 | 4K | 44 | | 134 | 134 | 268 |
| 110 | 4K | 40 | | 148 | 148 | 297 |
| 45 | 8K | 196 | | 22 | 22 | 44 |
| 55 | 8K | 160 | | 29 | 29 | 58 |
| 65 | 8K | 136 | | 36 | 36 | 72 |
| 75 | 8K | 118 | | 43 | 43 | 87 |
| 85 | 8K | 104 | | 51 | 51 | 101 |
| 100 | 8K | 88 | | 62 | 62 | 123 |
| 110 | 8K | 80 | | 69 | 69 | 138 |

As can be seen from Table 2 above, when the second width W2 is 9 μm, the first width W1 is greater than 2 times the second width W2 and less than or equal to 68 times the second width W2. The first pixel opening 221 and the second pixel opening 222 have the same first width W1, the first width W1 corresponding to the first pixel opening 221 and the second pixel opening 222 is greater than 2.4 times the second width W2 and less than or equal to 34.2 times the second width W2 when the second width W2 is 9 μm. The first width W1 of the third pixel opening 223 is relatively large, and the first width W1 corresponding to the third pixel opening 223 is larger than 4.8 times the second width W2 and less than or equal to 68.2 times the second width W2 when the second width W2 is 9 μm.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 13 microns, for different sizes of the active area, and different resolutions and pixel densities, the width of each pixel opening 220 in the first direction X is set in the manner shown in Table 3:

TABLE 3

| Size of active area | Resolution | PPI | W2 | W1_R | W1_G | W1_B |
|---|---|---|---|---|---|---|
| 45 | 2K | 49 | 13 | 116 | 116 | 232 |
| 55 | 2K | 40 | | 145 | 145 | 291 |
| 65 | 2K | 34 | | 173 | 173 | 347 |
| 75 | 2K | 30 | | 202 | 202 | 404 |
| 85 | 2K | 26 | | 231 | 231 | 461 |
| 100 | 2K | 22 | | 275 | 275 | 550 |
| 110 | 2K | 20 | | 304 | 304 | 608 |
| 45 | 4K | 98 | | 51 | 51 | 103 |
| 55 | 4K | 80 | | 66 | 66 | 132 |
| 65 | 4K | 68 | | 80 | 80 | 160 |
| 75 | 4K | 59 | | 94 | 94 | 188 |
| 85 | 4K | 52 | | 109 | 109 | 217 |
| 100 | 4K | 44 | | 131 | 131 | 262 |
| 110 | 4K | 40 | | 145 | 145 | 291 |
| 45 | 8K | 196 | | 19 | 19 | 38 |
| 55 | 8K | 160 | | 26 | 26 | 52 |
| 65 | 8K | 136 | | 33 | 33 | 66 |
| 75 | 8K | 118 | | 40 | 40 | 81 |
| 85 | 8K | 104 | | 48 | 48 | 95 |
| 100 | 8K | 88 | | 59 | 59 | 117 |
| 110 | 8K | 80 | | 66 | 66 | 132 |

As can be seen from Table 3 above, when the second width W2 is 13 μm, the first width W1 is greater than the second width W2 and less than or equal to 47 times the second width W2. The first pixel opening 221 and the second pixel opening 222 have the same first width W1, the first width W1 corresponding to the first pixel opening 221 and the second pixel opening 222 is greater than 1.4 times the second width W2 and less than or equal to 23.4 times the second width W2 when the second width W2 is 13 μm. The first width W1 of the third pixel opening 223 is relatively large, and the first width W1 corresponding to the third pixel opening 223 is larger than 2.9 times the second width W2 and less than or equal to 46.8 times the second width W2 when the second width W2 is 13 μm.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 15 microns, for different sizes of the active area, and different resolutions and pixel densities, the width of each pixel opening 220 in the first direction X is set in the manner shown in Table 4:

TABLE 4

| Size of active area | Resolution | PPI | W2 | W1_R | W1_G | W1_B |
|---|---|---|---|---|---|---|
| 45 | 2K | 49 | 15 | 111 | 111 | 222 |
| 55 | 2K | 40 | | 140 | 140 | 280 |
| 65 | 2K | 34 | | 168 | 168 | 336 |
| 75 | 2K | 30 | | 197 | 197 | 393 |
| 85 | 2K | 26 | | 225 | 225 | 451 |
| 100 | 2K | 22 | | 270 | 270 | 540 |
| 110 | 2K | 20 | | 299 | 299 | 598 |
| 45 | 4K | 98 | | 46 | 46 | 92 |
| 55 | 4K | 80 | | 61 | 61 | 121 |
| 65 | 4K | 68 | | 75 | 75 | 149 |
| 75 | 4K | 59 | | 89 | 89 | 178 |
| 85 | 4K | 52 | | 103 | 103 | 207 |
| 100 | 4K | 44 | | 126 | 126 | 251 |
| 110 | 4K | 40 | | 140 | 140 | 280 |
| 45 | 8K | 196 | | 14 | 14 | 27 |
| 55 | 8K | 160 | | 21 | 21 | 42 |
| 65 | 8K | 136 | | 28 | 28 | 56 |
| 75 | 8K | 118 | | 35 | 35 | 70 |
| 85 | 8K | 104 | | 42 | 42 | 85 |
| 100 | 8K | 88 | | 53 | 53 | 107 |
| 110 | 8K | 80 | | 61 | 61 | 121 |

As can be seen from Table 4 above, when the second width W2 is 15 μm, the first width W1 is greater than or equal to the second width W2 and less than or equal to 40 times the second width W2. The first pixel opening 221 and the second pixel opening 222 have the same first width W1, the first width W1 corresponding to the first pixel opening 221 and the second pixel opening 222 is greater than or equal to the second width W2 and less than or equal to 20 times the second width W2 when the second width W2 is 15 μm. The first width W1 of the third pixel opening 223 is relatively large, and the first width W1 corresponding to the third pixel opening 223 is larger than 2 times the second width W2 and less than or equal to 40 times the second width W2 when the second width W2 is 15 μm. When calculating the multiple between the first width W1 and the second width W2, the result is rounded to the nearest integer.

Figure 16:
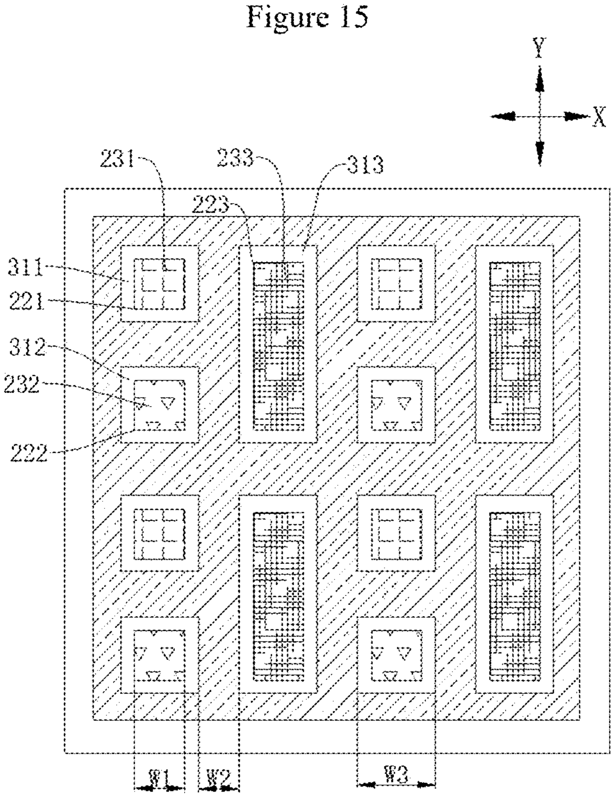
FIG. 16 is a structural schematic partial enlarged view of FIG. 1 in another example.

In some other embodiments, as shown in FIG. 16, a plurality of first light-emitting units 231 and a plurality of second light-emitting units 232 are arranged alternately in the second direction Y to form a fourth pixel column, and a plurality of third light-emitting units 233 are arranged sequentially at intervals in the second direction Y to form a fifth pixel column. The fourth pixel column and the fifth pixel column are arranged sequentially alternately in the first direction X. In one embodiment, the extension dimension of the third light-emitting unit 233 in the first direction X is less than the extension dimension thereof in the second direction Y. Correspondingly, the extension dimension of the third pixel opening 223 in the first direction X is less than the extension dimension thereof in the second direction Y, and the width direction of the third pixel opening 223 may be the first direction X or the second direction Y. For the first light-emitting unit 231 and the second light-emitting unit 232, the extension dimensions of the first light-emitting unit 231 and the second light-emitting unit 232 in the first direction X and the extension dimensions thereof in the second direction Y may be different or the same. For example, the extension dimensions of the first light-emitting unit 231 and the second light-emitting unit 232 in the first direction X are the same, and the extension dimension of the first light-emitting unit 231 in the second direction Y is less than the extension dimension thereof in the first direction X, the dimensions of the second light-emitting unit 232 in the first direction X and in the second direction Y may be the same, or the extension dimension of the second light-emitting unit 232 in the second direction Y is greater than the extension dimension thereof in the first direction X.

In one embodiment, the comparison between the second width W2 and the first width W1 may be a comparison made in a same direction.

When the plurality of light-emitting units 230 are arranged in the manner shown in FIG. 16 to form the fourth pixel column and the fifth pixel column, for different sizes of the active area AA, and different resolutions and pixel densities, the width of each pixel opening 220 in the first direction X is set in the manner shown in Table 5:

TABLE 5

| Size of active area | Resolution | W2 | W1_R | W1_G | W1_ B |
|---|---|---|---|---|---|
| 110 | 2K | 15 | 675.5 | 675.5 | 544.5 |
| 45 | 8K | 5 | 56.5 | 52. | 38.5 |

As can be seen from Table 5 above, when the first width W1 and the second width W2 are both taken from the first direction X, that is, the extension dimension of the orthographic projection of the pixel opening 220 on the base substrate 100*a* in the first direction X is the first width W1, and the spacing between the orthographic projections of two adjacent isolation openings 310 on the base substrate 100*a* in the first direction X is the second width W2. First, the second width W2 takes different values for different display sizes and resolutions. When the size of the active area is 110 inches and the resolution is 2K, the second width is 15 microns, and the first width W1 is greater than or equal to 36.3 times the second width W2 and less than or equal to 45 times the second width W2. When the size of the active area is 45 inches in size and the resolution is 8K, the pixel density is relatively high, and the first width W1 is greater than or equal to 7.7 times the second width W2 and less than or equal to 11.3 times the second width W2.

Figure 7:
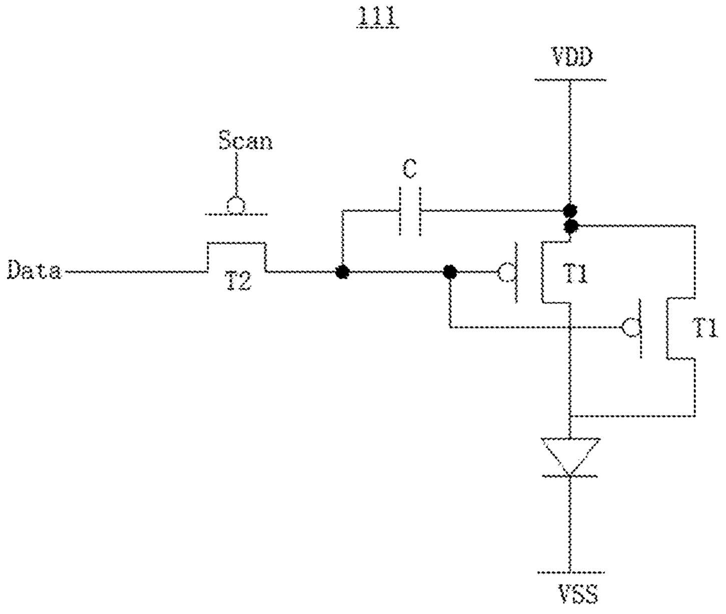
FIG. 7 is a structural schematic diagram of a pixel drive circuit of a display panel according to another embodiment of the present application.

When the plurality of light-emitting units 230 are arranged in the manner shown in FIG. 7 to form the fourth pixel column and the fifth pixel column, for different sizes of the active area AA, and different resolutions and pixel densities, the width of each pixel opening 220 in the second direction Y is set in the manner shown in Table 6:

TABLE 6

| Size of active area | Resolution | W2 | W1_R | W1_G | W1_B |
|---|---|---|---|---|---|
| 110 | 2K | 15 | 345 | 880 | 1250 |
| 45 | 8K | 5 | 25.5 | 67.5 | 110 |

As can be seen from Table 6 above, when the first width W1 and the second width W2 are both taken from the second direction Y, that is, the extension dimension of the orthographic projection of the pixel opening 220 on the base substrate 100*a* in the second direction Y is the first width W1, and the spacing between the orthographic projections of two adjacent isolation openings 310 on the base substrate 100*a* in the second direction Y is the second width W2. First, the second width W2 takes different values for different display sizes and resolutions. When the size of the active area is 110 inches and the resolution is 2K, the second width is 15 microns, and the first width W1 is greater than or equal to 34.5 times the second width W2 and less than or equal to 125 times the second width W2. When the size of the active area is 45 inches in size and the resolution is 8K, the pixel density is relatively high, and the first width W1 is greater than or equal to 2.55 times the second width W2 and less than or equal to 11 times the second width W2.

As shown in FIGS. 3 and 16, a plurality of light-emitting units 230 are arranged in the first direction X and in the second direction Y to form a plurality of columns, and the second width W2, the first width W1 of the pixel opening 220 and the third width W3 of the isolation opening 310 can take values in a same direction. In some other embodiments, when a plurality of light-emitting units 230 are arranged in the manner shown in FIGS. 3 and 16, the second width W2 of the isolation structure 300, the first width W1 of the pixel opening 220 and the third width W3 of the isolation opening 310 may also not take values in a same direction.

Figure 17:
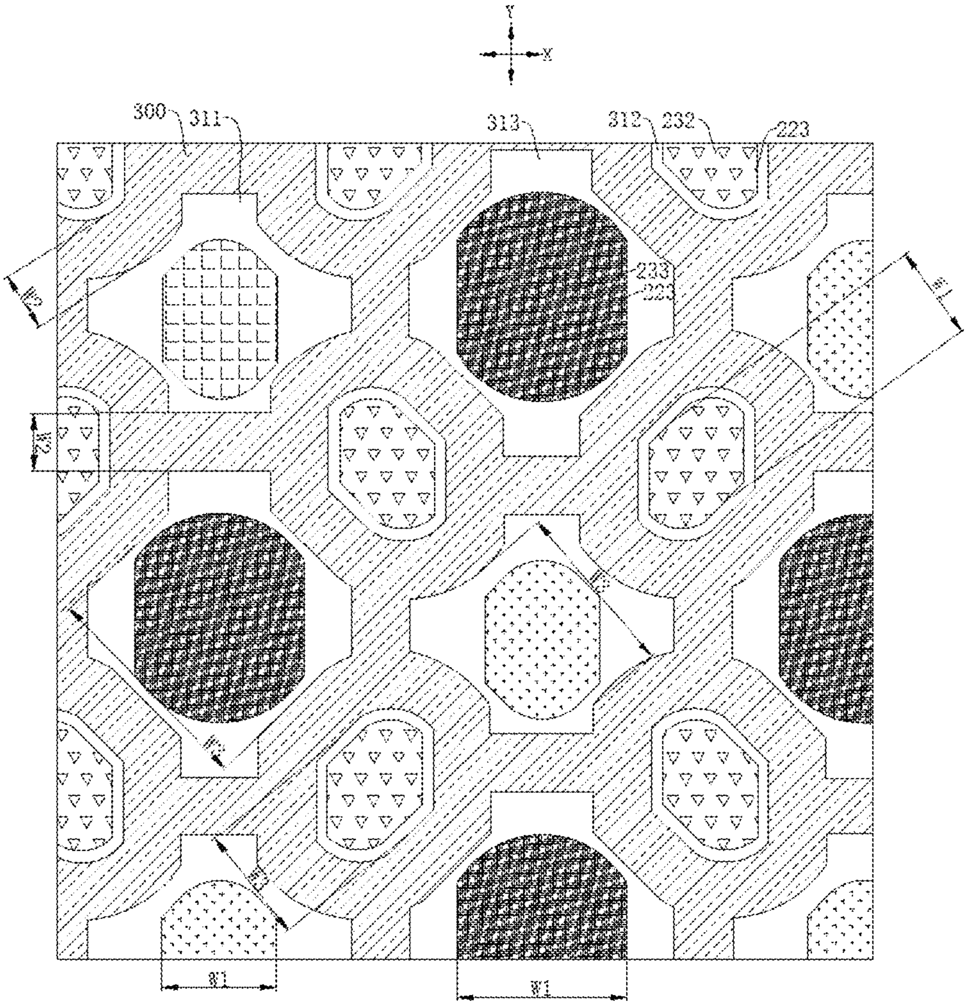
FIG. 17 is a structural schematic partial enlarged view of FIG. 1 in still another example.

In still other embodiments, as shown in FIG. 17, the first light-emitting units 231 and the third light-emitting units 233 are arranged alternately in the first direction X to form a first pixel row, a plurality of second light-emitting units 232 are arranged sequentially in the first direction X to form a second pixel row, and the second light-emitting unit 232 is correspondingly disposed between the first light-emitting unit 231 and the third light-emitting unit 233. The second width W2 may take a value in the first direction X or in the second direction Y, or the second width W2 may take a value in any direction intersecting the first direction X. The second width W2 may be the spacing between any two adjacent isolation openings 310. For example, the second width W2 may be the minimum spacing between two adjacent isolation openings 310, or the second width W2 may be the maximum spacing between two adjacent isolation openings 310, or the second width W2 may be any value between the minimum spacing between two adjacent isolation openings 310 and the maximum spacing between two adjacent isolation openings 310.

In one embodiment, as shown in FIGS. 3, 16 and 17, the embodiments of the present application are illustrated by taking an example where the second width W2 is the maximum spacing between two adjacent isolation openings 310. The maximum spacing between two adjacent isolation openings 310 has a relatively large influence on the aperture ratio and the pixel density of the display panel 10. In the embodiments of the present application, the second width W2 of the isolation structure 300 is designed with the second width W2 being the maximum spacing between two adjacent isolation openings 310, and the display panel 10 can be better adapted to large-size display devices.

Likewise, as shown in FIG. 17, when the shape of each of the isolation opening 310 and the pixel opening 220 is not a regular rectangle, the width of the orthographic projection of the isolation opening 310 on the substrate 100 in any direction may be used as the third width W3. For example, the minimum width of the orthographic projection of the isolation opening 310 on the substrate 100 is used as the third width W3, or the maximum width of the orthographic projection of the isolation opening 310 on the substrate 100 is used as the third width W3, or any value between the minimum width and the maximum width of the orthographic projection of the isolation opening 310 on the substrate 100 is used as the third width W3.

In one embodiment, as shown in FIGS. 3, 16 and 17, the embodiments of the present application are illustrated by taking an example where the minimum width of the orthographic projection of the isolation opening 310 on the substrate 100 is used as the third width W3. The minimum width of the orthographic projection of the isolation opening 310 on the substrate 100 has a relatively large influence on the aperture ratio and the pixel density of the display panel 10. In the embodiments of the present application, the use of the minimum width of the orthographic projection of the isolation opening 310 on the substrate 100 as the third width W3 enables the display panel 10 to be better adapted to large-size display devices. When the isolation openings 310 includes a first isolation opening 311, a second isolation opening 312, and a third isolation opening 313, the third width W3 may be a minimum width of an orthographic projection of any of the first isolation opening 311, the second isolation opening 312, and the third isolation opening 313 on the substrate 100.

Figure 8:
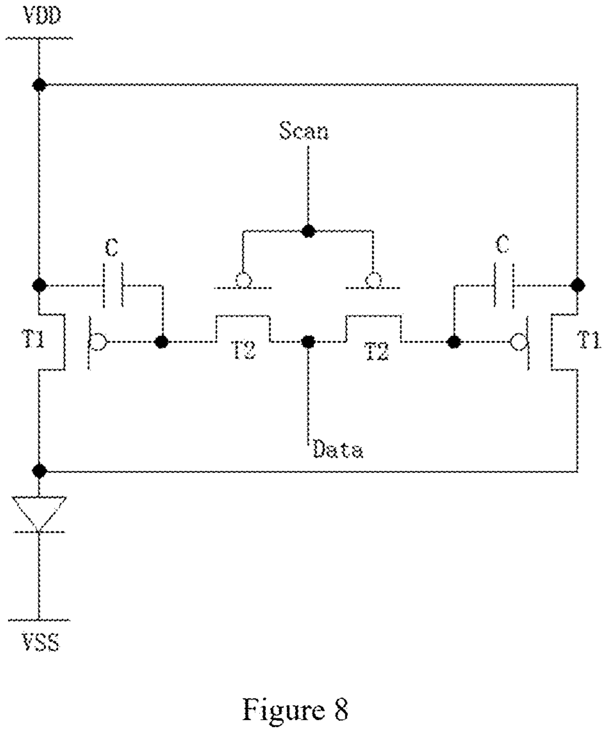
FIG. 8 is a structural schematic diagram of a pixel drive circuit of a display panel according to still another embodiment of the present application.

As shown in FIG. 8, the orthographic projection of the pixel opening 220 on the substrate 100 has a first width W1. In one embodiment, the width of the orthographic projection of the pixel opening 220 on the substrate 100 in any direction may be used as the first width W1. For example, the minimum width of the orthographic projection of the pixel opening 220 on the substrate 100 is used as the first width W1, or the maximum width of the orthographic projection of the pixel opening 220 on the substrate 100 is used as the first width W1, or any value between the minimum width and the maximum width of the orthographic projection of the pixel opening 220 on the substrate 100 is used as the first width W1.

In one embodiment, as shown in FIGS. 3, 16 and 17, the embodiments of the present application are illustrated by taking an example where the minimum width of the orthographic projection of the pixel opening 220 on the substrate 100 is used as the first width W1. The use of the minimum width of the orthographic projection of the pixel opening 220 on the substrate 100 as the first width W1 has a relatively large influence on the aperture ratio and the pixel density of the display panel 10. In the embodiments of the present application, the use of the minimum width of the orthographic projection of the pixel opening 220 on the substrate 100 as the first width W1 enables the display panel 10 to be better adapted to large-size display devices. When the plurality of pixel openings 220 includes a first pixel opening 221, a second pixel opening 222, and a third pixel opening 223, the first width W1 may be the minimum width of the orthographic projection of any one of the first pixel opening 221, the second pixel opening 222, and the third pixel opening 223 on the substrate 100.

In one embodiment, the plurality of isolation openings 310 are spaced apart in the first direction X and in the second direction Y, and the width a of the isolation opening 310 in the first direction X ranges from 20 μm to 650 μm; or the length b of the isolation opening 310 in the second direction Y ranges from 100 μm to 1300 μm. In these embodiments, when the size of the isolation opening 310 is within the above range, the size of the isolation opening 310 is relatively large and the isolation opening 310 can be suitable for large-screen display devices such as televisions.

In one embodiment, the width a of the isolation structure 300 in the first direction X may be the third width W3 as described above.

In some embodiments, as shown in FIGS. 3 and 16, in a same direction, the width of the orthographic projection of the isolation opening 310 on the base substrate 100*a* is defined as the third width W3, the width of the isolation structure 300 on the base substrate 100*a* is defined as the second width W2, and the third width W3 is greater than 2 times the second width W2 and less than or equal to 125 times the second width W2. The third width W3 is set as described above and will not be described here again.

In these embodiments, the width dimension of the isolation opening 310 being greater than the width dimension of the isolation structure 300 enables the aperture ratio of the display panel 10 to be increased, and the display panel 10 is suitable for large-screen display devices such as televisions.

In one embodiment, as shown in FIG. 3, in the first direction X, the width of the orthographic projection of the isolation opening 310 on the base substrate 100*a* is the third width W3 as described above, and the width of the orthographic projection of the isolation structure 300 on the base substrate 100*a* is the second width W2 as described above.

In one embodiment, the second width W2 ranges from 3 μm to 6 μm, and the third width W3 is greater than 6 times the second width W2 and less than or equal to 125 times the second width W2; or the second width W2 ranges from 7 μm to 10 μm, and the third width W3 is greater than 3 times the second width W2 and less than or equal to 69 times the second width W2; or the second width W2 ranges from 11 μm to 16 μm, and the third width W3 is greater than 2 times the second width W2 and less than or equal to 47 times the second width W2.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 5 microns, for different active area sizes, different resolutions and pixel densities, the width of each isolation opening 310 in the first direction X is set in the manner shown in Table 7:

TABLE 7

| Size of active area | Resolution | PPI | W2 | W3_R | W3_G | W3_B |
|---|---|---|---|---|---|---|
| 45 | 2K | 49 | 5 | 127 | 127 | 249 |
| 55 | 2K | 40 | | 156 | 156 | 308 |
| 65 | 2K | 34 | | 184 | 184 | 364 |
| 75 | 2K | 30 | | 213 | 213 | 421 |
| 85 | 2K | 26 | | 242 | 242 | 478 |
| 100 | 2K | 22 | | 286 | 286 | 567 |
| 110 | 2K | 20 | | 315 | 315 | 625 |
| 45 | 4K | 98 | | 62 | 62 | 120 |
| 55 | 4K | 80 | | 77 | 77 | 149 |
| 65 | 4K | 68 | | 91 | 91 | 177 |
| 75 | 4K | 59 | | 105 | 105 | 205 |
| 85 | 4K | 52 | | 120 | 120 | 234 |
| 100 | 4K | 44 | | 142 | 142 | 279 |
| 110 | 4K | 40 | | 156 | 156 | 308 |
| 45 | 8K | 196 | | 30 | 30 | 55 |
| 55 | 8K | 160 | | 37 | 37 | 69 |
| 65 | 8K | 136 | | 44 | 44 | 83 |
| 75 | 8K | 118 | | 51 | 51 | 98 |
| 85 | 8K | 104 | | 59 | 59 | 112 |
| 100 | 8K | 88 | | 70 | 70 | 134 |
| 110 | 8K | 80 | | 77 | 77 | 149 |

In Table 7, the size of the active area is in inches, for example, the size of 45 of the active area in the table indicates an active area of 45 inches. PPI is the pixel density. W2 is the second width W2 in microns of the isolation structure 300 in the first direction X. W3_R may be the first width W1 of the first isolation opening 311 in the first direction X, W3_G may be the width of the second isolation opening 312 in the first direction X, and W3_B may be the width of the third isolation opening 313 in the first direction X. The third width W3 is also in microns.

As can be seen from Table 7 above, when the second width W2 is 5 μm, the third width W3 is greater than 6 times the second width W2 and less than or equal to 125 times the second width W2. The first isolation opening 311 and the second isolation opening 312 have the same third width W3, and the third width W3 corresponding to the first isolation opening 311 and the second isolation opening 312 is greater than 6 times the second width W2 and less than or equal to 57.2 times the second width W2 when the second width W2 is 5 μm. The third width W3 of the third isolation opening 313 is relatively large, and the third width W3 corresponding to the third isolation opening 313 is larger than 11 times the second width W2 and less than or equal to 125 times the second width W2 when the second width W2 is 5 μm.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 9 microns, for different active area sizes, different resolutions and pixel densities, the width of each isolation opening 310 in the first direction X is set in the manner shown in Table 8:

TABLE 8

| Size of active area | Resolution | PPI | W2 | W3_R | W3_G | W3_B |
|---|---|---|---|---|---|---|
| 45 | 2K | 49 | 9 | 124 | 124 | 243 |
| 55 | 2K | 40 | | 153 | 153 | 302 |
| 65 | 2K | 34 | | 181 | 181 | 358 |
| 75 | 2K | 30 | | 210 | 210 | 415 |
| 85 | 2K | 26 | | 239 | 239 | 472 |
| 100 | 2K | 22 | | 283 | 283 | 561 |
| 110 | 2K | 20 | | 312 | 312 | 619 |
| 45 | 4K | 98 | | 59 | 59 | 114 |
| 55 | 4K | 80 | | 74 | 74 | 143 |
| 65 | 4K | 68 | | 88 | 88 | 171 |

TABLE 8-continued

| Size of active area | Resolution | PPI | W2 | W3_R | W3_G | W3_B |
|---|---|---|---|---|---|---|
| 75 | 4K | 59 | | 102 | 102 | 199 |
| 85 | 4K | 52 | | 117 | 117 | 228 |
| 100 | 4K | 44 | | 139 | 139 | 273 |
| 110 | 4K | 40 | | 153 | 153 | 302 |
| 45 | 8K | 196 | | 27 | 27 | 49 |
| 55 | 8K | 160 | | 34 | 34 | 63 |
| 65 | 8K | 136 | | 41 | 41 | 77 |
| 75 | 8K | 118 | | 48 | 48 | 92 |
| 85 | 8K | 104 | | 56 | 56 | 106 |
| 100 | 8K | 88 | | 67 | 67 | 128 |
| 110 | 8K | 80 | | 74 | 74 | 143 |

As can be seen from Table 8 above, when the second width W2 is 9 μm, the third width W3 is greater than 3 times the second width W2 and less than or equal to 69 times the second width W2. The first isolation opening 311 and the second isolation opening 312 have the same third width W3, and the third width W3 corresponding to the first isolation opening 311 and the second isolation opening 312 is greater than 3 times the second width W2 and less than or equal to 34.6 times the second width W2 when the second width W2 is 9 μm. The third width W3 of the third isolation opening 313 is relatively large, and the third width W3 corresponding to the third isolation opening 313 is larger than 5.4 times the second width W2 and less than or equal to 68.7 times the second width W2 when the second width W2 is 9 μm.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 13 microns, for different active area sizes, different resolutions and pixel densities, the width of each isolation opening 310 in the first direction X is set in the manner shown in Table 9:

TABLE 9

| Size of active area | Resolution | PPI | W2 | W3_R | W3_G | W3_B |
|---|---|---|---|---|---|---|
| 45 | 2K | 49 | 13 | 121 | 121 | 237 |
| 55 | 2K | 40 | | 150 | 150 | 296 |
| 65 | 2K | 34 | | 178 | 178 | 352 |
| 75 | 2K | 30 | | 207 | 207 | 409 |
| 85 | 2K | 26 | | 236 | 236 | 466 |
| 100 | 2K | 22 | | 280 | 280 | 555 |
| 110 | 2K | 20 | | 309 | 309 | 613 |
| 45 | 4K | 98 | | 56 | 56 | 108 |
| 55 | 4K | 80 | | 71 | 71 | 137 |
| 65 | 4K | 68 | | 85 | 85 | 165 |
| 75 | 4K | 59 | | 99 | 99 | 193 |
| 85 | 4K | 52 | | 114 | 114 | 222 |
| 100 | 4K | 44 | | 136 | 136 | 267 |
| 110 | 4K | 40 | | 150 | 150 | 296 |
| 45 | 8K | 196 | | 24 | 24 | 43 |
| 55 | 8K | 160 | | 31 | 31 | 57 |
| 65 | 8K | 136 | | 38 | 38 | 71 |
| 75 | 8K | 118 | | 45 | 45 | 86 |
| 85 | 8K | 104 | | 53 | 53 | 100 |
| 100 | 8K | 88 | | 64 | 64 | 122 |
| 110 | 8K | 80 | | 71 | 71 | 137 |

As can be seen from Table 9 above, when the second width W2 is 13 μm, the third width W3 is greater than 2 times the second width W2 and less than or equal to 47 times the second width W2. The first isolation opening 311 and the second isolation opening 312 have the same third width W3, and the third width W3 corresponding to the first isolation opening 311 and the second isolation opening 312 is greater than 1.8 times the second width W2 and less than or equal to 23.8 times the second width W2 when the second width W2 is 13 μm. The third width W3 of the third isolation opening 313 is relatively large, and the third width W3 corresponding to the third isolation opening 313 is larger than 3.3 times the second width W2 and less than or equal to 47.2 times the second width W2 when the second width W2 is 13 μm.

When the first light-emitting units 231 are red light-emitting units 230, the second light-emitting units 232 are green light-emitting units 230, and the third light-emitting units 233 are blue light-emitting units 230, the plurality of light-emitting units 230 are arranged to form the first pixel column, the second pixel column and the third pixel column as described above. When the second width W2 is 15 microns, for different active area sizes, different resolutions and pixel densities, the width of each isolation opening 310 in the first direction X is set in the manner shown in Table 10:

TABLE 10

| Size of active area | Resolution | PPI | W2 | W3_R | W3_G | W3_B |
|---|---|---|---|---|---|---|
| 45 | 2K | 49 | 15 | 121 | 121 | 232 |
| 55 | 2K | 40 | | 150 | 150 | 290 |
| 65 | 2K | 34 | | 178 | 178 | 346 |
| 75 | 2K | 30 | | 207 | 207 | 403 |
| 85 | 2K | 26 | | 235 | 235 | 461 |
| 100 | 2K | 22 | | 280 | 280 | 550 |
| 110 | 2K | 20 | | 309 | 309 | 608 |
| 45 | 4K | 98 | | 56 | 56 | 102 |
| 55 | 4K | 80 | | 71 | 71 | 131 |
| 65 | 4K | 68 | | 85 | 85 | 159 |
| 75 | 4K | 59 | | 99 | 99 | 188 |
| 85 | 4K | 52 | | 113 | 113 | 217 |
| 100 | 4K | 44 | | 136 | 136 | 261 |
| 110 | 4K | 40 | | 150 | 150 | 290 |
| 45 | 8K | 196 | | 24 | 24 | 37 |
| 55 | 8K | 160 | | 31 | 31 | 52 |
| 65 | 8K | 136 | | 38 | 38 | 66 |
| 75 | 8K | 118 | | 45 | 45 | 80 |
| 85 | 8K | 104 | | 52 | 52 | 95 |
| 100 | 8K | 88 | | 63 | 63 | 117 |
| 110 | 8K | 80 | | 71 | 71 | 131 |

As can be seen from Table 10 above, when the second width W2 is 15 μm, the third width W3 is greater than 2 times the second width W2 and less than or equal to 41 times the second width W2. The first isolation opening 311 and the second isolation opening 312 have the same third width W3, and the third width W3 corresponding to the first isolation opening 311 and the second isolation opening 312 is greater than 2 times the second width W2 and less than or equal to 21 times the second width W2 when the second width W2 is 15 μm. The third width W3 of the third isolation opening 313 is relatively large, and the third width W3 corresponding to the third isolation opening 313 is larger than 2 times the second width W2 and less than or equal to 41 times the second width W2 when the second width W2 is 13 μm. When calculating the multiple relationship between the third width W3 and the second width W2, the result is rounded to the nearest integer.

In some other embodiments, as shown in FIG. 16, a plurality of first light-emitting units 231 and a plurality of second light-emitting units 232 are arranged alternately in the second direction Y to form a fourth pixel column, and a plurality of third light-emitting units 233 are arranged sequentially at intervals in the second direction Y to form a fifth pixel column. The fourth pixel column and the fifth pixel column are arranged sequentially alternately in the first direction X. In one embodiment, the extension dimension of the third light-emitting unit 233 in the first direction X is less than the extension dimension thereof in the second direction Y. Correspondingly, the extension dimension of the third pixel opening 223 in the first direction X is less than the extension dimension thereof in the second direction Y, and the width direction of the third pixel opening 223 may be the first direction X or the second direction Y. For the first light-emitting unit 231 and the second light-emitting unit 232, the extension dimensions of the first light-emitting unit 231 and the second light-emitting unit 232 in the first direction X and the extension dimensions thereof in the second direction Y may be different or the same. For example, the extension dimensions of the first light-emitting unit 231 and the second light-emitting unit 232 in the first direction X are the same, and the extension dimension of the first light-emitting unit 231 in the second direction Y is less than the extension dimension thereof in the first direction X, the dimensions of the second light-emitting unit 232 in the first direction X and in the second direction Y may be the same, or the extension dimension of the second light-emitting unit 232 in the second direction Y is greater than the extension dimension thereof in the first direction X.

In one embodiment, the comparison between the second width W2 and the third width W3 may be a comparison made in a same direction. When the plurality of light-emitting units 230 are arranged in the manner shown in FIG. 16 to form the fourth pixel column and the fifth pixel column, for different sizes of the active area AA, and different resolutions and pixel densities, the width of each pixel opening 220 in the first direction X is set in the manner shown in Table 11:

TABLE 11

| Size of active area | Resolution | W2 | W3_R | W3_G | W3_B |
|---|---|---|---|---|---|
| 110 | 2K | 15 | 685.5 | 685.5 | 554.5 |
| 45 | 8K | 5 | 66.5 | 66.5 | 48.5 |

As can be seen from Table 11 above, when the third width W3 and the second width W2 are both taken from the first direction X, that is, the extension dimension of the orthographic projection of the isolation opening 310 on the base substrate 100*a* in the first direction X is the third width W3, and the extension dimension of the orthographic projection of the isolation structure 300 on the base substrate 100*a* in the first direction X is the second width W2. First, the second width W2 takes different values for different display sizes and resolutions. When the size of the active area is 110 inches and the resolution is 2K, the second width is 15 microns, and the third width W3 is greater than or equal to 37 times the second width W2 and less than or equal to 45.7 times the second width W2. When the size of the active area is 45 inches in size and the resolution is 8K, the pixel density is relatively high, and the third width W3 is greater than or equal to 9.7 times the second width W2 and less than or equal to 13.3 times the second width W2.

When the plurality of light-emitting units 230 are arranged in the manner shown in FIG. 16 to form the fourth pixel column and the fifth pixel column, for different sizes of the active area AA, and different resolutions and pixel densities, the width of each pixel opening 220 in the second direction Y is set in the manner shown in Table 12:

TABLE 12

| Size of active area | Resolution | W2 | W3_R | W3_G | W3_B |
|---|---|---|---|---|---|
| 110 | 2K | 15 | 355 | 890 | 1260 |
| 45 | 8K | 5 | 35.5 | 77.5 | 120 |

As can be seen from Table 12 above, when the third width W3 and the second width W2 are both taken from the second direction Y, that is, the extension dimension of the orthographic projection of the isolation opening 310 on the base substrate 100*a* in the second direction Y is the third width W3, and the extension dimension of the orthographic projection of the isolation structure 300 on the base substrate 100*a* in the second direction Y is the second width W2. First, the second width W2 takes different values for different display sizes and resolutions. When the size of the active area is 110 inches and the resolution is 2K, the second width is 15 microns, and the third width W3 is greater than or equal to 23.7 times the second width W2 and less than or equal to 84 times the second width W2. When the size of the active area is 45 inches in size and the resolution is 8K, the pixel density is relatively high, and the third width W3 is greater than or equal to 7.1 times the second width W2 and less than or equal to 24 times the second width W2.

Figure 18:
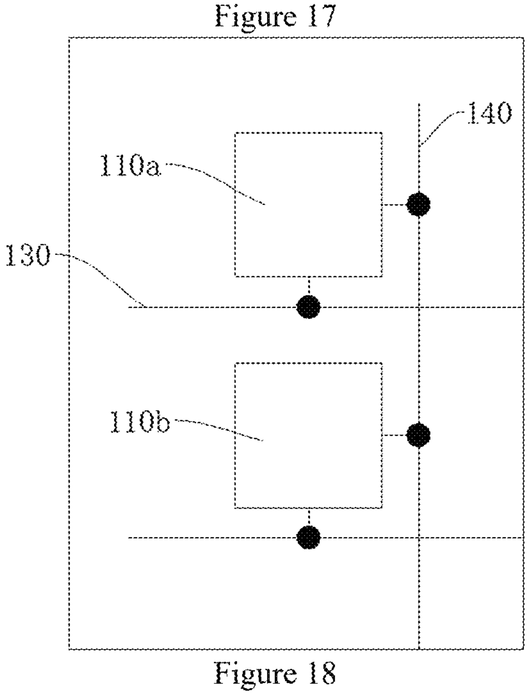
FIG. 18 is a structural schematic partial enlarged view of FIG. 2.
Figure 19:
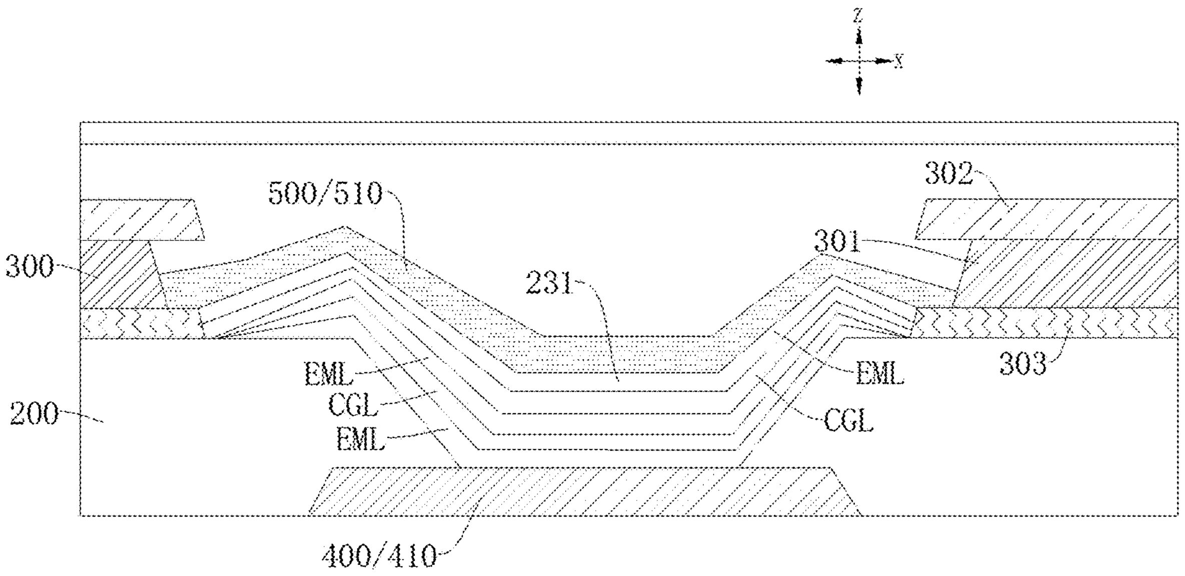
FIG. 19 is a structural schematic partial enlarged view of FIG. 4 in still another example.
Figure 20:
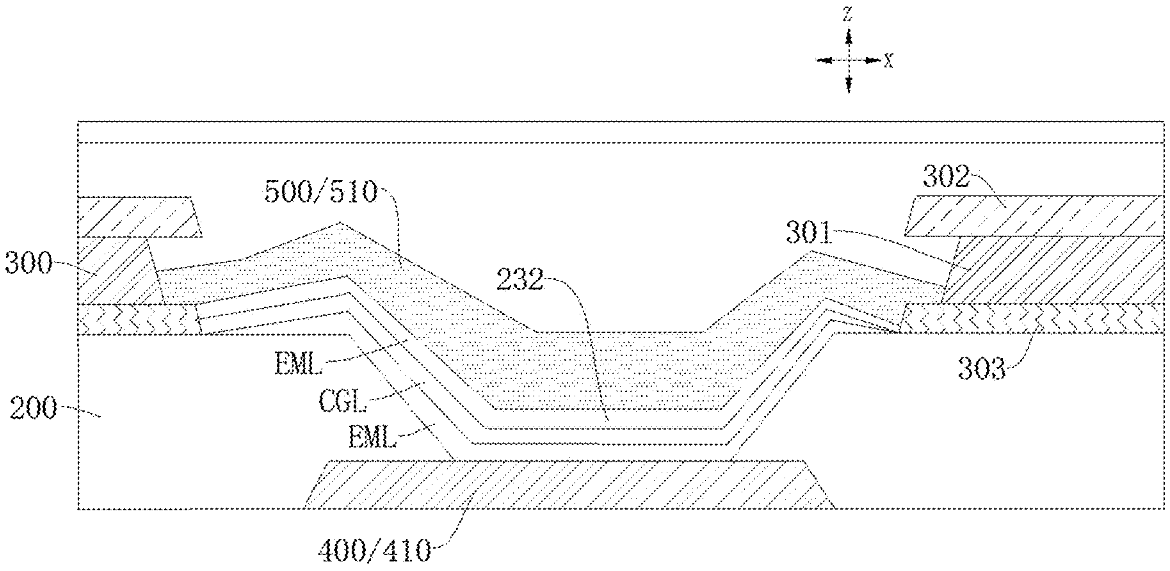
FIG. 20 is a structural schematic partial enlarged view of FIG. 4 in yet another example.

In some embodiments, as shown in FIGS. 18 to 20, the light-emitting unit 230 includes a light-emitting material layer EML, and a plurality of light-emitting units 230 include a first light-emitting unit 231 and a second light-emitting unit 232 of different light-emitting colors. The number of light-emitting material layers EML of the first light-emitting unit 231 is greater than the number of light-emitting material layers EML of the second light-emitting unit 232. A plurality of drive units 110 include a first drive unit 110*a* for driving the first light-emitting unit 231 and a second drive unit 110*b* for driving the second light-emitting unit 232. The number of drive transistors T1 of the first drive unit 110*a* is less than the number of drive transistors T1 of the second drive unit 110*b*, or a channel width of the drive transistor T1 of the first drive unit 110*a* is less than a channel width of the drive transistor T1 of the second drive unit 110*b*.

In these embodiments, the number of light-emitting material layers EML of the first light-emitting unit 231 is greater than the number of light-emitting material layers EML of the second light-emitting unit 232, the light-emitting efficiency of the first light-emitting unit 231 is higher than the light-emitting efficiency of the second light-emitting unit 232, and a smaller drive current is required by the first light-emitting unit 231 to achieve the same brightness, and the number of drive transistors T1 of the first drive unit is less than the number of drive transistors T1 of the second drive unit 110*b*, or the channel width of the drive transistor T1 of the first drive unit 110*a* is less than the channel width of the drive transistor T1 of the second drive unit 110*b*, and the power consumption of the display panel 10 can thus be reduced.

As shown in FIG. 19, the number of light-emitting material layers EML of the first light-emitting unit 231 may be 3. As shown in FIG. 20, and the number of light-emitting material layers EML of the second light-emitting unit 232 is 2. When the light-emitting unit 230 includes two or more light-emitting material layers EML, a charge generation layer CGL is provided between the two light-emitting material layers EML. In one embodiment, in the direction away from the substrate 100, a hole injection layer and a hole transport layer may be provided between a first light-emitting material layer EML and the first electrode 410, and an electron transport layer and an electron injection layer may be provided between the first light-emitting material layer EML and the charge generation layer CGL. A hole injection layer and a hole transport layer may be provided between a second light-emitting material layer EML and the charge generation layer CGL, that is, a hole injection layer and a hole transport layer may be provided between the light-emitting material layer EML and the charge generation layer CGL or the first electrode 410 located on a side of the light-emitting material layer facing the substrate 100. An electron transport layer and an electron injection layer may be provided between the light-emitting material layer EML and the charge generation layer CGL or the second electrode 510 located on a side of the light-emitting material layer facing away from the substrate 100.

As shown in FIG. 4, the display panel 10 further includes a second encapsulation layer 620 and a third encapsulation layer 630. The second encapsulation layer 620 covers the isolation structure 300 and the encapsulation portion 611, and the third encapsulation layer 630 covers the second encapsulation layer 620. The first encapsulation layer 610 and the third encapsulation layer 630 are each made of an inorganic material, including at least one of silicon nitride (SiN), silicon oxide (SiO), and silicon oxynitride (SiON). The second encapsulation layer 620 is made of an organic insulating material, including a resin material such as epoxy resin or acrylic resin. The second encapsulation layer 620 and the third encapsulation layer 630 are at least continuously disposed on the entire active area AA, and also partially on the non-active area NA.

The display panel 10 may further include at least one additional film layer, such as a touch layer, a polarizer, a color filter substrate 100, or a protective cover plate. The film layer may be bonded to the display panel 10 via an adhesive layer such as optical clear adhesive (OCA).

In some embodiments, the present application further provides a display apparatus, including a display panel 10 in the present application. The display apparatus may include devices with image processing capabilities, such as smartphones, desktop computers, laptops, tablet computers, vehicle-mounted displays, and wearable devices. Since the display apparatus includes the display panel 10 in the present application, the display apparatus has the beneficial effects as the display panel 10 described above and will not be described here again.

In some embodiments, the present application further provides a device, including a display panel 10 in the present application. The device may include a device with an image processing capability, such as a television, a desktop computer, a laptop, a tablet computer, a vehicle-mounted display, and a wearable device. Since the device includes the display panel 10 in the present application, the device has the beneficial effects as the display panel 10 described above and will not be described here again. In one embodiment, a size of an active area of the device is greater than or equal to 35 inches, or a pixel density of the device is less than or equal to 100 pixels per inch. In this way, the device can achieve the purpose of large-size display.

The above embodiments may be combined arbitrarily. For the purpose of brevity of description, all the possible combinations of the features in the above embodiments are not described. However, as long as there is no contradiction between the combinations of these features, they shall all fall within the scope of the specification. The above embodiments merely represent several embodiments of the present disclosure, giving specifics and details thereof, but should not be understood as limiting the scope of the patent of the present disclosure thereby. It should be noted that various variations and improvements may also be made without departing from the spirit of the present application and shall fall within the scope of protection of the present application. Therefore, the scope of protection of the present application shall be in accordance with the appended claims.

Although the present application has been described with reference to some embodiments, various modifications can be made, and components can be replaced with equivalents, without departing from the scope of the present application. In particular, the features mentioned in the embodiments can be combined in any manner, provided that there is no structural conflict. The present application is not limited to the specific embodiments disclosed herein but includes all the embodiments that fall within the scope of the claims.

What is claimed is:

1. A display panel, comprising:

a substrate comprising a base substrate and drive units disposed on one side of the base substrate;

a planarization layer located on a side of the drive unit facing away from the base substrate and comprising first communication holes;

a first electrode layer disposed on one side of the substrate and comprising a plurality of first electrodes;

a pixel defining layer disposed on one side of the substrate, the pixel defining layer comprising a pixel defining portion and pixel openings enclosed by the pixel defining portion, an orthographic projection of the pixel opening on the base substrate at least partially overlapping an orthographic projection of the first electrode on the base substrate;

an isolation structure disposed on the side of the substrate where the pixel defining layer is located and enclosing a plurality of isolation openings, the isolation opening being in communication with the pixel opening; and a light-emitting functional layer comprising light-emitting units located in the isolation openings, at least part of the light-emitting unit being located in the pixel opening, wherein the drive unit is electrically connected to the first electrode by the first communication hole, and at least one of the drive units comprises two or more drive transistors, the drive transistor being electrically connected to the first electrode and configured to transmit a drive current to the light-emitting unit to drive the light-emitting unit to emit light.

2. The display panel according to claim 1, wherein the drive unit comprises one pixel drive circuit, the pixel drive circuit comprising the two or more drive transistors, and the two or more drive transistors of the pixel drive circuit connected to the same first electrode being connected in parallel.

3. The display panel according to claim 2, wherein the two or more drive transistors connected to the same first electrode are electrically connected to the first electrode by the same first communication hole.

4. The display panel according to claim 1, wherein the drive unit comprises two or more pixel drive circuits, each of the pixel drive circuits comprising one of the drive transistors, and the drive transistors of the two or more pixel drive circuits being connected to the same first electrode.

5. The display panel according to claim 4, wherein the drive transistors of the two or more pixel drive circuits are connected to the same first electrode by the same first communication hole; or the first electrode is disposed corresponding to two or more first communication holes, and orthographic projections on the base substrate of the two or more first communication holes corresponding to the same first electrode are spaced apart on a peripheral side of the orthographic projection of the first electrode on the base substrate, and the two or more pixel drive circuits connected to the same first electrode and the first communication holes are disposed in one-to-one correspondence.

6. The display panel according to claim 1, wherein the first electrode comprises two or more sub-electrodes, and the drive unit comprises two or more pixel drive circuits, each of the pixel drive circuits comprising one of the drive transistors, the sub-electrodes and the pixel drive circuits being disposed in one-to-one correspondence, each of the sub-electrodes being disposed corresponding to the first communication hole, and the drive transistor of each of the pixel drive circuits being electrically connected to the sub-electrode by the first communication hole.

7. The display panel according to claim 6, wherein the first electrode comprises two sub-electrodes, the two sub-electrodes of the same first electrode being spaced apart in a second direction, and two first communication holes corresponding to the two sub-electrodes of the same first electrode being located on opposite sides of the two sub-electrodes in the second direction.

8. The display panel according to claim 6, wherein the substrate further comprises first signal lines extending in a first direction and second signal lines extending in a second direction, a plurality of pixel drive circuits connected to a plurality of sub-electrodes of the same first electrode being connected to the same first signal line and the same second signal line, wherein the first signal line comprises at least one of a scan signal line and a light emission control signal line, and the second signal line comprises a data signal line.

9. The display panel according to claim 6, wherein the light-emitting unit comprises two or more sub-light-emitting units, the sub-light-emitting units and the sub-electrodes being disposed in one-to-one correspondence, the pixel opening comprises two or more first sub-openings, at least part of the sub-light-emitting unit being located in the first sub-opening, and the isolation opening comprises two or more second sub-openings, each of the sub-light-emitting units being located in a respective second sub-opening; or the pixel opening comprises two or more first sub-openings, the first sub-openings and the sub-electrodes being disposed in one-to-one correspondence, the two or more first sub-openings being disposed corresponding to the same isolation opening, and at least parts of the light-emitting unit within the same the isolation opening being located in the two or more first sub-openings.

10. The display panel according to claim 1, wherein the isolation structure comprises a first sublayer and a second sublayer stacked in a direction away from the base substrate, the second sublayer protruding toward the isolation opening relative to the first sublayer, and the first sublayer comprising a first side surface facing the isolation opening, wherein a material of the first sublayer comprises copper, and the first side surface is a flat surface or a curved surface with a smooth transition; or the material of the first sublayer comprises aluminum, and the first side surface comprises a first subsurface and a second subsurface connected to each other in a direction away from the substrate, the first subsurface intersecting the second subsurface.

11. The display panel according to claim 10, wherein the first sublayer comprises a first bottom surface facing the base substrate, the material of the first sublayer comprises copper, and a first included angle of 40° to 85° is formed between the first side surface and the first bottom surface.

12. The display panel according to claim 10, wherein the material of the first sublayer comprises aluminum, the first side surface comprises a first subsurface and a second subsurface disposed successively in a direction away from the substrate, the first sublayer comprises a first bottom surface facing the base substrate, a second included angle is formed between the first subsurface and the first bottom surface, and a third included angle is formed between an extension plane of the second subsurface and an extension plane of the first bottom surface, the second included angle being less than the third included angle; and a difference between the third included angle and the second included angle ranging from 2° to 20°.

13. The display panel according to claim 10, wherein the second sublayer protrudes toward the isolation opening relative to the first sublayer by a first distance, a plurality of light-emitting units comprise a first light-emitting unit and a second light-emitting unit of different light-emitting colors, and the isolation openings comprise a first isolation opening for receiving the first light-emitting unit and a second isolation opening for receiving the second light-emitting unit, wherein the material of the first sublayer comprises copper, and the first distance corresponding to the first isolation opening is equal to the first distance corresponding to the second isolation opening; or the material of the first sublayer comprises aluminum, and the first distance corresponding to the first isolation opening is different from the first distance corresponding to the second isolation opening, wherein the material of the first sublayer comprises copper, the first distance ranges from 0.8 μm to 1.6 μm, the first sublayer has a first height, and a ratio of the first distance to the first height ranges from 0.75 to 2; or the material of the first sublayer comprises aluminum, the first distance ranges from 0.7 μm to 1.1 μm, the first sublayer has a first height, and a ratio of the first distance to the first height ranges from 0.8 to 1.3.

14. The display panel according to claim 10, wherein the material of the first sublayer comprises copper, and the first side surface facing at least one of the isolation openings is provided with a plurality of spaced-apart covering portions, a material of the covering portion comprising copper oxide.

15. The display panel according to claim 10, wherein the isolation structure further comprises a third sublayer located on a side of the first sublayer facing the substrate, the third sublayer protruding toward the substrate relative to the first sublayer; and the display panel further comprises a second electrode located on a side of the light-emitting unit facing away from the substrate, the second electrode comprising a main portion and a contact portion in the form of a closed ring surrounding the main portion, the contact portion being in contact with and connected to the third sublayer.

16. The display panel according to claim 1, wherein in a same direction, a width of the orthographic projection of the pixel opening on the base substrate is defined as a first width, a spacing between orthographic projections of two adjacent isolation openings on the base substrate is defined as a second width, and the first width is greater than the second width and less than or equal to 124 times the second width;

the second width ranges from 3 μm to 6 μm, and the first width is greater than 5 times the second width and less than or equal to 124 times the second width; or the second width ranges from 7 μm to 12 μm, and the first width is greater than 2 times the second width and less than or equal to 68 times the second width; or the second width ranges from 11 μm to 15 μm, and the first width is greater than the second width and less than or equal to 47 times the second width.

17. The display panel according to claim 1, wherein in a same direction, a width of an orthographic projection of the isolation opening on the base substrate is defined as a third width, a spacing between orthographic projections of two adjacent isolation openings on the base substrate is defined as a second width, and the third width is greater than 2 times the second width and less than or equal to 125 times the second width;

the second width ranges from 3 μm to 6 μm, and the third width is greater than 6 times the second width and less than or equal to 125 times the second width; or the second width ranges from 7 μm to 12 μm, and the third width is greater than 3 times the second width and less than or equal to 69 times the second width; or the second width ranges from 11 μm to 14 μm, and the third width is greater than 2 times the second width and less than or equal to 47 times the second width; or the second width ranges from 14 μm to 16 μm, and the third width is greater than or equal to 2 times the second width and less than or equal to 47 times the second width.

18. The display panel according to claim 1, wherein the plurality of isolation openings are spaced apart in a first direction and in a second direction, and a width of the isolation structure in the first direction ranges from 20 μm to 650 μm; or a length of the isolation opening in the second direction ranges from 100 μm to 1300 μm.

19. The display panel according to claim 1, wherein the light-emitting unit comprises a light-emitting material layer, and a plurality of light-emitting units comprise a first light-emitting unit and a second light-emitting unit of different light-emitting colors, the number of light-emitting material layers of the first light-emitting unit being greater than the number of light-emitting material layers of the second light-emitting unit; and a plurality of drive units comprise a first drive unit for driving the first light-emitting unit and a second drive unit for driving the second light-emitting unit, wherein the number of drive transistors of the first drive unit is less than the number of drive transistors of the second drive unit, or a channel width of the drive transistor of the first drive unit is less than a channel width of the drive transistor of the second drive unit.

20. A device, comprising:

a display panel, comprising:

a substrate comprising a base substrate and drive units disposed on one side of the base substrate;

a planarization layer located on a side of the drive unit facing away from the base substrate and comprising first communication holes;

a first electrode layer disposed on one side of the substrate and comprising a plurality of first electrodes;

a pixel defining layer disposed on one side of the substrate, the pixel defining layer comprising a pixel defining portion and pixel openings enclosed by the pixel defining portion, an orthographic projection of the pixel opening on the base substrate at least partially overlapping an orthographic projection of the first electrode on the base substrate;

an isolation structure disposed on the side of the substrate where the pixel defining layer is located and enclosing a plurality of isolation openings, the isolation opening being in communication with the pixel opening; and a light-emitting functional layer comprising light-emitting units located in the isolation openings, at least part of the light-emitting unit being located in the pixel opening, wherein the drive unit is electrically connected to the first electrode by the first communication hole, and at least one of the drive units comprises two or more drive transistors, the drive transistor being electrically connected to the first electrode and configured to transmit a drive current to the light-emitting unit to drive the light-emitting unit to emit light, wherein a size of an active area of the device is greater than or equal to 35 inches, or a pixel density of the device is less than or equal to 100 pixels per inch.

* * * * *